US008897061B2

(12) United States Patent
Ezaki

(10) Patent No.: US 8,897,061 B2
(45) Date of Patent: Nov. 25, 2014

(54) MTJ CELL FOR AN MRAM DEVICE AND A MANUFACTURING METHOD THEREOF

(71) Applicant: QuantuMag Consultancy Corp., Nagano (JP)

(72) Inventor: Joichiro Ezaki, Nagano (JP)

(73) Assignee: QuantuMag Consultancy Corp., Saku-shi, Nagano (JP)

( * ) Notice: Subject to any disclaimer, the term of this patent is extended or adjusted under 35 U.S.C. 154(b) by 0 days.

(21) Appl. No.: 13/752,850

(22) Filed: Jan. 29, 2013

(65) Prior Publication Data

US 2013/0201755 A1 Aug. 8, 2013

(30) Foreign Application Priority Data

Jan. 30, 2012 (JP) .................................. 2012-017117
Apr. 27, 2012 (JP) .................................. 2012-104057
Jan. 29, 2013 (JP) .................................. 2013-014824

(51) Int. Cl.
   *G11C 11/00* (2006.01)
   *G11C 11/16* (2006.01)
   *H01L 43/12* (2006.01)
   *H01L 43/02* (2006.01)
   *H01L 43/08* (2006.01)
   *H01L 27/22* (2006.01)

(52) U.S. Cl.
   CPC .......... *G11C 11/1675* (2013.01); *G11C 11/161* (2013.01); *H01L 43/12* (2013.01); *H01L 43/02* (2013.01); *G11C 11/1673* (2013.01); *H01L 43/08* (2013.01); *H01L 27/228* (2013.01)
   USPC ........... 365/158; 365/171; 365/173; 365/157; 365/232; 365/63

(58) Field of Classification Search
   CPC ...... G11C 11/16; G11C 11/15; H01L 27/228; H01L 43/08; G11B 5/3903
   USPC ..................... 365/158, 171, 173, 157, 232, 63
   See application file for complete search history.

(56) References Cited

U.S. PATENT DOCUMENTS

2011/0002163 A1* 1/2011 Fukami et al. ................. 365/173

FOREIGN PATENT DOCUMENTS

| JP | 2005-044847 | 2/2005 |
|---|---|---|
| JP | 2005-203535 | 7/2005 |
| JP | 2008-235659 | 10/2008 |

* cited by examiner

*Primary Examiner* — Thong Q Le
(74) *Attorney, Agent, or Firm* — Greer, Burns & Crain, Ltd.

(57) ABSTRACT

An MTJ cell includes a first metal layer elongated in the X-direction; a second metal layer separated from the first metal layer and elongated in the Y-direction; a magnetic tunnel junction (MTJ) interposed between the overlapping parts of the first and second metal layers and having extended parts not covered by the second metal layer, the MTJ including a pinned layer, a barrier layer, and a storage layer sequentially laminated; and a yoke spanning across the second metal layer, with both ends in the X-direction contacting the top surface of the extended parts of the storage layer not covered by the second metal layer, either directly or through an insulator. The planar shapes of the MTJ and the yoke possess a quantum easy axis in the X-direction and Y-direction, respectively.

41 Claims, 18 Drawing Sheets

(a)

(b)

(c)

(a)

(b)

(c)

(a)

(b)

(c)

(a)

(b)

(c)

(d)

(a)

(b)

(a)

(b)

(a)

(b)

| | example 1 | example 2 | example 3 |
|---|---|---|---|
| Rfo | Ro | $\dfrac{Ro(Rs+Rb)}{2Rb}$ | $\dfrac{Ro(Rs+Rb)}{2Rs}$ |
| Rf | (Rs+Rb)/2 | Rs | Rb |

Note:
Rs = "0" of Rm
Rb = "1" of Rm

MTJ CELL FOR AN MRAM DEVICE AND A MANUFACTURING METHOD THEREOF

CROSS-REFERENCE TO RELATED APPLICATIONS

The present application claims priority to Japanese Patent Application Nos. JP 2012-017117 filed Jan. 30, 2012; JP 2012-104057 filed Apr. 27, 2012; and JP 2013-014824 filed Jan. 29, 2013 under 35 U.S.C. §§119(a) and 365(b), all of which are incorporated herein by reference.

BACKGROUND

1. Field of the Invention

The present invention relates to an MTJ cell, and particularly to a yoke-type MTJ cell and manufacturing method thereof, and to an MTJ-based MRAM device.

2. Description of the Related Art

Magnetoresistive random-access memory (MRAM) devices configured of magnetic tunnel junctions (MTJ) use magnetized states of cells to store data. Hence, unlike DRAM and similar memory devices, MRAM devices are nonvolatile, meaning that they preserve the storage state even when the power supply is switched off. In addition to this feature, MRAM devices show potential for high-speed random-access times (a few nanoseconds), similar to those of SRAM, as well as a large storage capacity on par with DRAM. Consequently, MRAM devices have become a popular subject of research and development.

As is well known, an MTJ has three stacked layers, including a ferromagnetic pinned layer, a nonmagnetic barrier layer, and a ferromagnetic storage layer (hereinafter referred to simply as the "pinned layer," "barrier layer," and "storage layer"). While the magnetization direction of the pinned layer is fixed, magnetization of the storage layer can be changed between a parallel and antiparallel orientation with the magnetization of the pinned layer, greatly changing the electrical resistance in the stacked direction of the MTJ between a small and large resistance. The MRAM device uses the magnitude of this resistance as the storage state for one bit worth of data.

A write operation on the MTJ is performed by passing a write current of prescribed magnitude in one direction or the other through a conductive line contacting the storage layer of the MTJ. The write current produces an induced magnetic field near the MTJ modifying the direction of magnetization in the storage layer. A read operation is performed by detecting the magnitude of resistance in the MTJ when a current flows between the conductive line and pinned layer, for example.

However, unlike with DRAM and other memory types, it is presently not possible to reduce the write current for an MTJ to a few milliamperes (mA) or less when the MTJ is reduced below a certain size. This is a first problem related to MTJs and occurs because the coercivity of a ferromagnet increases as it is reduced in size. This leads to an increase in the magnetic field strength required to reverse its magnetization, i.e., an increase in the write current needed to induce the magnetic field.

Given that DRAM and other circuits commonly handle currents of several hundred microamperes (μA) at most, employing MTJs with write currents of around ten times that magnitude in an MRAM device would cause serious strain on the peripheral circuits of the device, and the write lines in particular. Thus, monolithic integration of MTJs with peripheral circuits using high-definition CMOS technology, for example, would be highly difficult to implement.

A second problem with MTJs is their sensitivity to strong external magnetic fields. Since an MTJ stores data based on the difference between the magnetization of the storage layer and pinned layer, proper storage and proper read/write operations become impossible when a strong external magnetic field changes the direction of magnetization in the storage layer or in both the storage layer and the pinned layer.

A third problem associated with MTJs arises in MRAM devices formed through large-scale integration of MTJs. Namely, the induced magnetic field generated by the write current for a specific MTJ may leak and influence adjacent MTJs, leading to potential false writes.

A yoke-type MTJ has recently been proposed to resolve these problems. The yoke-type MTJ has a ferromagnetic layer or high-permeability magnetic layer called a "yoke" for covering the conductive line that contacts and supplies a write current to the storage layer of the MTJ so that the conductive line is surrounded by the storage layer and yoke. Patent Documents 1-3 indicated below describe examples of yoke-type MTJs.

The storage layer and yoke surrounding the conductive line form a closed magnetic path in the yoke-type MTJ. As a result, the magnetic field strength generated in the storage layer when the write current flows through the conductive line is roughly twice that of a yoke-less MTJ. In other words, the write current for producing a comparable magnetic field strength needed to reverse magnetization can be halved.

However, even this MTJ configuration has not been enough to reduce write current values to an order of mA or less, making it fundamentally difficult to resolve the above-mentioned first problem. However, the yoke-type MTJ does offer a solution to the second and third problems, since the yoke produces a magnetic shielding effect.

SUMMARY

In view of the foregoing problems, and particularly to the resolution of the first problem, it is an object of the present invention to provide an MTJ cell capable of dramatically reducing write currents, and a method of manufacturing this MTJ cell. It is another object of the present invention to provide an MRAM device employing these MTJ cells that is capable of attaining fast read/write times and that is suited to higher integration.

These objects will be attained by an MTJ cell according to one aspect of the invention, comprising a first metal layer disposed on the surface of a substrate aligned with an XY plane and elongated in the X-direction (one end in the elongated direction having a terminal R); a second metal layer separated from the first metal layer in a Z-direction (hereinafter "above") and elongated in the Y-direction orthogonal to the X-direction (ends in the elongated direction having terminals Wp and Wn, respectively); a magnetic tunnel junction (hereinafter "MTJ") interposed between overlapping parts of the first and second metal layers; and a yoke spanning across and covering a portion of the second metal layer.

The MTJ comprises a ferromagnetic pinned layer, a nonmagnetic barrier layer, and a ferromagnetic storage layer (hereinafter simply called the "pinned layer," "barrier layer," and "storage layer," respectively) stacked in the order given and including extended parts not covered by the second metal layer. The MTJ produces a small resistance or a large resistance in the Z-direction, respectively assigned a "0" state and "1" state, depending on whether the magnetization states of the pinned layer and the storage layer are parallel or antiparallel. The yoke comprises a ferromagnetic material or a high-permeability magnetic material, and both ends of the yoke in the X-direction contact extended parts of the storage layer not covered by the second metal layer, either directly or through a nonmagnetic insulating layer.

The storage layer of the MTJ has a shape in an XY plane possessing a quantum easy axis in the X-direction, while the yoke has a shape in an XY plane possessing a quantum easy axis in the Y-direction. The storage layer exhibits a relaxed coupling with the yoke at the extended parts not covered by the second metal layer that essentially satisfies the continuity of flux return directly or indirectly through a nonmagnetic insulating layer, while maintaining a quantum easy axis orthogonal to that of the yoke. The YZ cross-sectional area of the yoke is greater than the YZ cross-sectional area of the storage layer.

In order to provide the storage layer and the yoke with a quantum easy axis through shape anisotropy, the shape of the MTJ in the XY plane is preferably rectangular with its long sides aligned in the X-direction, and the shape of the yoke in the XY plane is rectangular with its long sides aligned in the Y-direction. The top surface on extended parts of the MTJ not covered by the second metal layer possesses a relaxed coupling through a nonmagnetic insulating layer. The quantum easy axes of the storage layer and the yoke are preferably formed to be independent of each other through deposition of an antiferromagnetic film.

The above objects will also be attained by an MTJ cell according to another aspect of the invention, comprising a first metal layer disposed on the surface of a substrate aligned with an XY plane and elongated in the X-direction (one end in the elongated direction having a terminal R); a second metal layer separated from the first metal layer in a Z-direction (hereinafter "above") and elongated in the Y-direction orthogonal to the X-direction (ends in the elongated direction having terminals Wp and Wn, respectively); a magnetic tunnel junction (hereinafter "MTJ") interposed between overlapping parts of the first and second metal layers; a yoke spanning across and covering a portion of the second metal layer; and a third metal layer elongated in the X-direction.

The MTJ comprises a ferromagnetic pinned layer, a nonmagnetic barrier layer, and a ferromagnetic storage layer (hereinafter simply called the "pinned layer," "barrier layer," and "storage layer," respectively) stacked in the order given and including extended parts not covered by the second metal layer. The MTJ produces a small resistance or a large resistance in the Z-direction, respectively assigned a "0" state and "1" state, depending on whether the magnetization states of the pinned layer and the storage layer are parallel or antiparallel. The yoke comprises a ferromagnetic material or a high-permeability magnetic material, and both ends of the yoke in the X-direction contact extended parts of the storage layer not covered by the second metal layer, either directly or through a nonmagnetic insulating layer.

The storage layer of the MTJ has a shape in an XY plane possessing a quantum easy axis in the X-direction, and the yoke has a shape in an XY plane possessing a quantum easy axis in the X-direction. The storage layer exhibits a relaxed coupling with the yoke at the extended parts not covered by the second metal layer that essentially satisfies the continuity of flux return directly or indirectly through a nonmagnetic insulating layer and maintains a quantum easy axis orthogonal to that of the yoke. The YZ cross-sectional area of the yoke is greater than the YZ cross-sectional area of the storage layer; and Y-direction quantum anisotropy is produced in the yoke by a magnetic field induced by a write bias current applied to the third metal layer.

The nonmagnetic insulating layer preferably comprises a first insulating layer shaped with a bird's beak, the tip of the bird's beak reaching the sloped surface of the storage layer; and a second insulating layer formed on top of the first insulating layer and shaped with a bird's beak, the tip of the bird's beak not reaching a position above the sloped surface of the storage layer. Preferably the MTJ cell further comprises a third insulating layer formed of a nonmagnetic material that is interposed between (1) the second metal layer and the nonmagnetic insulating layer and (2) the yoke.

The above objects will also be attained by a method of fabricating the MTJ cell according to another aspect of the invention, the method comprising forming the first insulating layer through deposition at a first angle of incidence; and forming the second insulating layer through deposition at a second angle of incidence different from the first angle of incidence.

The above objects will also be attained by an MRAM device according to another aspect of the invention, comprising a plurality of MRAM cells arranged in the XY plane, each MRAM cell comprising the MTJ cell described above; a transistor Qw whose source is connected to a terminal Wp in the MTJ cell; and a transistor Qr whose drain is connected to a terminal R in the MTJ cell. The gates of the transistors Qw and Qr are connected to an $i^{th}$ word line Wi (i=1, 2, . . . ). The drain of the Qw is connected to a $j^{th}$ first write bit line Bpj (j=1, 2, . . . ). The source of the Qr is connected to a $j^{th}$ read bit line Bj. The terminal Wn of the MTJ cell is connected to a $j^{th}$ second write bit line Bnj.

MRAM cells connected to the $i^{th}$ word line Wi are selected by driving the single $i^{th}$ word line Wi at high level to make the transistors Qw and Qr in the MRAM cells connected to the $i^{th}$ word line Wi conductive. A write operation to write a "0" is performed by applying a write current Iw to the selected column ($j^{th}$ column) flowing from the first write bit line Bpj to the second write bit line Bnj via the transistor Qw, the induced magnetic field changing the direction of the easy axis of magnetization in the storage layer of the MTJ belonging to the MRAM cell at an intersecting point (i, j) to match the direction of easy axis of magnetization in the pinned layer, and a write operation to write a "1" is performed by applying a write current Iw in the reverse direction, the induced magnetic field changing the direction of the easy axis of magnetization in the storage layer of the MTJ at the intersecting point (i, j) to the direction opposite the easy axis of magnetization in the pinned layer.

A read operation, on the other hand, is performed by applying a read voltage Vr to at least the second write bit line Bnj of the selected column ($j^{th}$ column) to conduct a tunnel current flowing through the MTJ via the transistor Qw and terminal Wp in the MRAM cell at the selected intersecting point (i, j) to the read bit line Bj via the terminal R, and by detecting a large or small tunnel current as a "0" or "1", respectively, with a sense amplifier provided on one end of the read bit line Bj.

The above objects will also be attained by an MRAM device according to another aspect of the invention, comprising a plurality of MRAM cells arranged in the XY plane, each MRAM cell comprising the MTJ cell described above; a transistor Qw whose source is connected to a terminal Wp in the MTJ cell; and a transistor Qr whose drain is connected to a terminal R in the MTJ cell. The gates of the transistors Qw and Qr are connected to an $i^{th}$ word line Wi (i=1, 2, . . . ). The drain of the Qw is connected to a $j^{th}$ first write bit line Bpj (j=1, 2, . . . ). The source of the Qr is connected to a ground line GND. The terminal Wn of the MTJ cell is connected to a $j^{th}$ second write bit line Bnj.

A sense amplifier is disposed on one of the first write bit line Bpj and the second write bit line Bnj. MRAM cells connected to the $i^{th}$ word line Wi are selected by driving the single $i^{th}$ word line Wi at high level to make the transistors Qw and Qr in the MRAM cells connected to the $i^{th}$ word line Wi conductive.

A write operation to write a "0" is performed by applying a write current Iw to the selected column ($j^{th}$ column) flowing from the first write bit line Bpj to the second write bit line Bnj via the transistor Qw, the induced magnetic field changing the direction of the easy axis of magnetization in the storage layer of the MTJ belonging to the MRAM cell at an intersecting point (i, j) to match the direction of easy axis of magnetization in the pinned layer, and a write operation to write a "1" is performed by applying a write current Iw in the reverse direction, the induced magnetic field changing the direction of the easy axis of magnetization in the storage layer of the MTJ at the intersecting point (i, j) to the direction opposite the easy axis of magnetization in the pinned layer.

A read operation is performed by applying a read voltage Vr to at least the second write bit line Bnj of the selected column ($j^{th}$ column) to conduct a tunnel current flowing through the MTJ either directly or via the transistor Qw and terminal Wp in the MRAM cell at the selected intersecting point (i, j) to the ground line GND through the transistor Qr, and by detecting a large or small tunnel current as a "0" or "1", respectively, with the sense amplifier.

The above objects will also be attained by an MRAM device according to another aspect of the invention, comprising a plurality of MRAM cells arranged in the XY plane, each MRAM cell comprising the MTJ cell described above; and a transistor Qr whose drain is connected to the terminal R of the MTJ cell. The gate of the transistor Qr is connected to the $i^{th}$ word line Wi (i=1, 2, ... ). The source of the transistor Qr is connected to the $j^{th}$ read bit line Bj (j=1, 2, ... ). Terminals Wp and Wn of the MTJ cell are respectively connected in sequence to terminals Wn and Wp of MTJ cells in neighboring cells to form a write bit line Bpj-Bnj (the ends of the line referred to as the Bpj end and Bnj end). Opposing ends Pp and Pn of the third metal layer in the MTJ cell are connected to ends Pp and Pn of the third metal layer in MTJ cells of neighboring MRAM cells to form an ith write bias line Wpi-Wni parallel to the word line Wi.

A write operation for writing a "0" is performed by applying a prescribed write bias current only to the selected ith write bias line Wpi-Wni and applying a write current Iw to the write bit line Bpj-Bnj of the selected column ($j^{th}$ column) in a direction from the Bpj end to the Bnj end, producing an induced magnetic field that changes the direction of the easy axis of magnetization in the storage layer of the MTJ at the intersecting point (i, j) to match the direction of the easy axis of magnetization in the pinned layer, and a write operation for writing a "1" is performed by applying the write current Iw in the reverse direction, producing an induced magnetic field that changes the direction of the easy axis of magnetization in the storage layer to the direction opposite the easy axis of magnetization in the pinned layer.

A read operation, on the other hand, is performed by driving only the selected $i^{th}$ word line Wi at the high level so that the transistors Qr in all MRAM cells of the selected row are made conductive, and by applying the read voltage Vr to the write bit line Bpj-Bnj of the selected column ($j^{th}$ column), conducting the tunnel current that flows through the MTJ in the MRAM cell at intersecting point (i, j) to the read bit line Bj via the transistor Qr, and the sense amplifier provided on an end of the read bit line Bj detects whether the tunnel current is large or small, i.e., "0" or "1".

The above objects will also be attained by an MRAM device according to another aspect of the invention, comprising a plurality of MRAM cells arranged in the XY plane, each MRAM cell comprising the MTJ cell described above; and a transistor Qr whose drain is connected to the terminal R of the MTJ cell. The gate of the transistor Qr is connected to the $i^{th}$ word line Wi (i=1, 2, ... ). The source of the transistor Qr is connected to a ground line GND. Terminals Wp and Wn of the MTJ cell are respectively connected in sequence to terminals Wn and Wp of MTJ cells in neighboring cells to form a write bit line Bpj-Bnj (the ends of the line referred to as the Bpj end and Bnj end). Opposing ends Pp and Pn of the third metal layer in the MTJ cell are connected to ends Pp and Pn of the third metal layer in MTJ cells of neighboring MRAM cells to form an ith write bias line Wpi-Wni parallel to the word line Wi.

A write operation for writing a "0" is performed by applying a prescribed write bias current only to the selected ith write bias line Wpi-Wni and applying a write current Iw to the write bit line Bpj-Bnj of the selected column ($j^{th}$ column) in a direction from the Bpj end to the Bnj end, producing an induced magnetic field that changes the direction of the easy axis of magnetization in the storage layer of the MTJ at the intersecting point (i, j) to match the direction of the easy axis of magnetization in the pinned layer, and a write operation for writing a "1" is performed by applying the write current Iw in the reverse direction, producing an induced magnetic field that changes the direction of the easy axis of magnetization in the storage layer to the direction opposite the easy axis of magnetization in the pinned layer.

A read operation, on the other hand, is performed by driving only the selected $i^{th}$ word line Wi at the high level so that the transistors Qr in all MRAM cells of the selected row are made conductive, and by applying the read voltage Vr to the write bit line Bpj-Bnj of the selected column ($j^{th}$ column), conducting the tunnel current that flows through the MTJ in the MRAM cell at intersecting point (i, j) to the ground line GND via the transistor Qr, and the sense amplifier detects whether the tunnel current in the MTJ is large or small, i.e., "0" or "1".

The above objects will also be attained by an MRAM device according to another aspect of the invention having a plurality of blocks arranged in a Y-direction, each block having a plurality of MRAM cells arranged in the XY plane, and each MRAM cell comprising the MTJ cell described above; and a transistor Qr whose drain is connected to the terminal R of the MTJ cell. The gate of the transistor Qr is connected to the $i^{th}$ word line Wi (i=1, 2, ... ). The source of the transistor Qr is connected to a ground line GND. Terminals Wp and Wn of the MTJ cell are respectively connected in sequence to terminals Wn and Wp of MTJ cells in neighboring cells to form a write bit line. The MRAM device further comprises transistors Qe whose drain is connected to one end of the write bit line and whose gate is connected to a block select/write enable (BS/WE). The other end of the write bit line is connected to a $j^{th}$ first write bit line Bpj (j=1, 2, ... ) extending in the Y-direction through the plurality of blocks. The source of the transistor Qe is connected to a $j^{th}$ second write bit line Bnj extending in the Y-direction through the plurality of blocks. A sense amplifier is disposed on one of the first write bit line Bpj and the second write bit line Bnj. Opposing ends Pp and Pn of the third metal layer in the MTJ cell are connected to ends Pp and Pn of the third metal layer in MTJ cells of neighboring MRAM cells to form an ith write bias line Wpi-Wni parallel to the word line Wi.

A write operation for writing a "0" is performed by applying a prescribed write bias current only to the selected $i^{th}$ write bias line Wpi-Wni of a block selected by driving the block select/write enable (BS/WE) at the high level and applying a write current Iw to the write bit lines of the selected column ($j^{th}$ column) in a direction from the $j^{th}$ first write bit line Bpj toward the $j^{th}$ second write bit line Bnj through a transistor Qe selected by the block select/write enable (BS/WE), producing an induced magnetic field that changes the direction of the easy axis of magnetization in the storage layer of the MTJ at the intersecting point (i, j) to match the direction of the easy axis of magnetization in the pinned layer, and a write operation for writing a "1" is performed by applying the write current Iw in the reverse direction, producing an induced magnetic field that changes the direction of the easy axis of magnetization in the storage layer to the direction opposite the easy axis of magnetization in the pinned layer.

A read operation, on the other hand, is performed by driving only the selected $i^{th}$ word line Wi of the selected block at the high level so that the transistors Qr in all MRAM cells of the selected row are made conductive, and by applying the read voltage Vr to the first and second write bit lines Bpj and Bnj of the selected column ($j^{th}$ column), conducting the tunnel current that flows through the MTJ in the MRAM cell at intersecting point (i, j) to the ground line GND via the transistor Qr, and the sense amplifier detects whether the tunnel current in the MTJ is large or small, i.e., "0" or "1".

The sense amplifier preferably comprises a circuit for generating a reference voltage corresponding to an intermediate value of the tunnel current at "0" (large) and the tunnel current at "1" (small); and the resistive element providing resistors that determine the value of the reference voltage is one of (1) a semiconductor resistor, (2) an MTJ whose pinned layer and storage layer have magnetization in the Y-direction and X-direction, respectively, through a fabrication process, (3) an MTJ whose pinned layer and storage layer have magnetization in the Y-direction and X-direction, respectively, through their planar shape, (4) a composite element including an MTJ cell storing a "0" and an MTJ cell storing a "1" immediately after the MRAM device is powered on, and (5) an MTJ cell storing either a "0" or a "1" immediately after the MRAM device is powered on.

The sense amplifier preferably comprises a circuit for generating a reference voltage corresponding to an intermediate value of the tunnel current at "0" (large) and the tunnel current at "1" (small); and the resistive element providing resistors that determine the value of the reference voltage is a composite element including an MTJ cell storing a "0" and an MTJ cell storing a "1" formed during the fabrication process of the MRAM device by magnetizing or applying a magnetic field to a yoke whose quantum easy axis is aligned in the X-direction.

The MRAM device preferably comprises a plurality of the resistive elements arranged in at least one column in the Y-direction.

Preferably, the MRAM device further comprises a first driver DRpj and a second driver DRnj respectively connected to the first and second write bit lines Bpj and Bnj. In a write operation, the first driver DRpj and the second driver DRnj respectively supply a high voltage VH and a low voltage VL to produce a write current Iw determined by the transistor Qw, or the first driver DRpj and the second driver DRnj respectively supply the low voltage VL and the high voltage VH to produce a write current Iw in the reverse direction determined by the transistor Qw. The read voltage Vr is larger than the low voltage VL but smaller than the high voltage VH.

Preferably, the MRAM device further comprises a first driver DRpj and a second driver DRnj respectively connected to the first and second write bit lines Bpj and Bnj. In a write operation, the second driver DRnj constantly supplies the read voltage Vr, and the first driver DRpj supplies a high voltage VH to produce a write current Iw determined by the transistor Qw, or the first driver DRpj supplies the low voltage VL to produce a write current Iw in the reverse direction determined by the transistor Qw. The read voltage Vr is larger than the low voltage VL but smaller than the high voltage VH.

Preferably, the MRAM device further comprises a first driver DRpj and a second driver DRnj connected to respective ends of the write bit line Bpj-Bnj. In a write operation, the second driver DRnj constantly supplies the read voltage Vr, and the first driver DRpj supplies a write current Iw or a write current Iw in the reverse direction. The read voltage Vr is larger than the low voltage VL but smaller than the high voltage VH.

Preferably, the MRAM device further comprises a first driver DRpj connected to the source of the transistor Qe and a second driver DRnj connected to the Bnj end of the write bit line Bpj-Bnj. In a write operation the first driver DRpj and the second driver DRnj respectively supply a high voltage VH and a low voltage VL to produce a write current Iw determined by the transistor Qe, or the first driver DRpj and the second driver DRnj respectively supply the low voltage VL and the high voltage VH to produce a write current Iw in the reverse direction determined by the transistor Qe. The read voltage Vr is larger than the low voltage VL but smaller than the high voltage VH.

The present invention can reduce the write current in an MTJ cell from the conventional level of about 5 mA to slightly over 100 μA, for example. The present invention can achieve a stable, low write current over a broad range of yoke aspect ratios and over a broad range of write bias current values. The present invention can produce an MRAM device with an integration density equivalent to or greater than that of DRAM according to the same design rules of silicon-based lithography.

BRIEF DESCRIPTION OF THE DRAWINGS

FIG. 1(*b*) is a transparent XY plan view of the first yoke-type MTJ cell;

FIG. 1(*c*) is an abbreviated circuit diagram of the first yoke-type MTJ cell;

FIG. 2(*b*) is a cross-sectional view taken along the XZ plane of a conventional yoke-type MTJ cell;

FIG. 2(*c*) is a cross-sectional view taken along the XZ plane of the yoke-type MTJ cell according to the first embodiment;

FIG. 4(*b*) is a transparent view of the XY plane at the stage of the process in FIG. 4(*a*);

FIG. 4(*c*) is a cross-sectional view taken along the XZ plane, illustrating the stage in the process after forming the three-layered structure of the MTJ using the second metal layer as a mask and prior to forming the yoke;

FIG. 4(d) is a transparent view of the XY plane at the stage of the process in FIG. 4(c);

DESCRIPTION OF THE PREFERRED EMBODIMENTS

Figure 1:
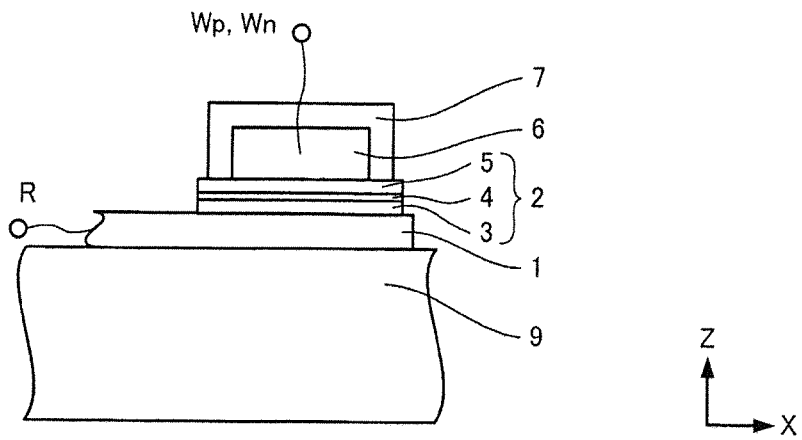
FIG. 1(*a*) is a cross-sectional view taken along the XZ plane of a first yoke-type MTJ cell employing a yoke-type magnetic tunnel junction (hereinafter simply referred to as "MTJ") according to a first embodiment of the invention.
Figure 1:
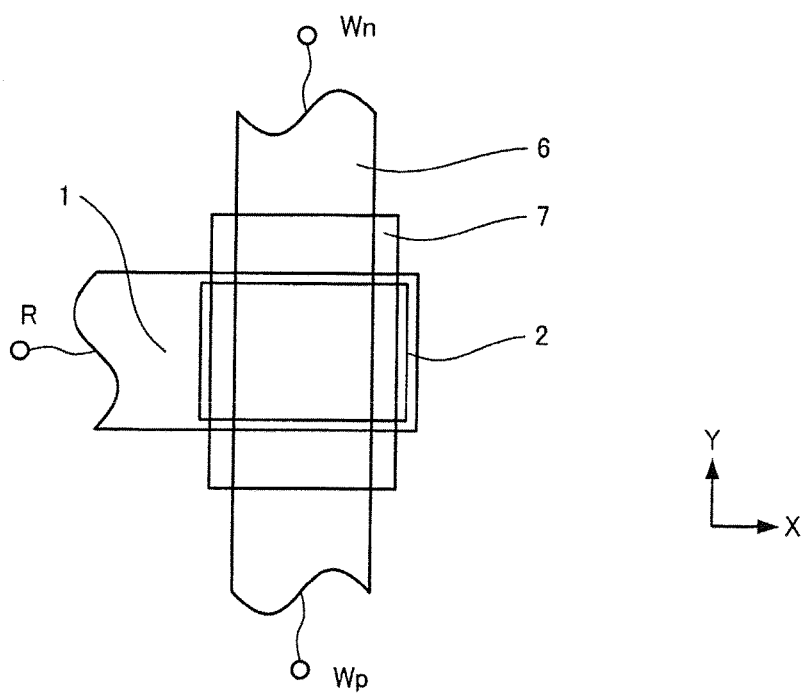
Figure 1:
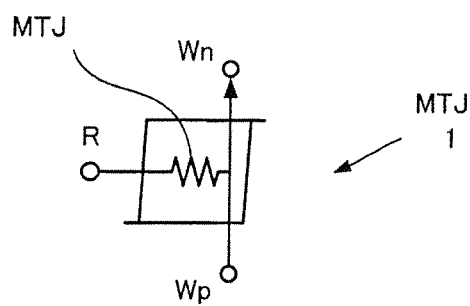

Next, preferred embodiments of the present invention will be described while referring to the accompanying drawings.

In the drawings, X- and Y-axes are orthogonal to each other and lie in the plane of a substrate 9. A Z-axis is set perpendicularly to the XY plane, and the direction along the Z-axis away from the substrate 9 will be considered the upward direction.

In its narrow sense, "MTJ" signifies only those parts that constitute a magnetic tunnel junction, while in its broad sense signifies an element that includes the narrow definition of MTJ and its peripheral parts. To differentiate between these two definitions in the following description, the former will be called simply "MTJ" while the latter will be called an "MTJ cell."

First Embodiment

First MTJ Cell

FIG. 1 includes schematic diagrams of a first yoke-type MTJ cell (hereinafter simply called a "first MTJ cell" and denoted by "MTJ1" in the drawings) employing a yoke-type magnetic tunnel junction (hereinafter simply referred to as "MTJ") according to a preferred embodiment. FIG. 1(a) is a cross-sectional view of the first MTJ cell showing an XZ plane viewed along the Y-axis. FIG. 1(b) is a transparent XY plan view of the first MTJ cell viewed along the Z-axis. FIG. 1(c) is an abbreviated circuit diagram of the first MTJ cell.

As shown in FIGS. 1(a) and 1(b), the first MTJ cell includes a first metal layer 1 provided on the XY planar surface of the substrate 9 and elongated in the X-direction, a second metal layer 6 provided above and separated from the first metal layer 1 and elongated in the Y-direction, an MTJ 2 interposed between the overlapping parts of the first and second metal layers 1 and 6, and a yoke 7 spanning across and covering the second metal layer 6. The MTJ 2 has three stacked layers including a ferromagnetic pinned layer 3, a nonmagnetic barrier layer 4, and a ferromagnetic storage layer 5. The MTJ 2 includes extended parts not covered by the second metal layer 6. The yoke 7 is formed of a ferromagnetic layer or high-permeability magnetic layer. Both ends of the yoke 7 in the X-direction contact the top surface of the extended parts of the storage layer 5 not covered by the second metal layer 6, either directly or through a nonmagnetic layer. The contours of the first metal layer 1, MTJ 2, second metal layer 6, and yoke 7 are intentionally offset in the drawings to eliminate overlap in order to clearly depict their outer shapes and superposition relationships and do not necessarily represent the actual contours with accuracy.

For a later description of circuit functions, the drawings also include a terminal R added to one extended part of the first metal layer 1, and terminals Wp and Wn respectively added to the two extended parts of the second metal layer 6. FIG. 1(c) is an abbreviated circuit diagram of the first MTJ cell expressed in terms of the terminals R, Wp, and Wn. A write operation to this MTJ cell is achieved by passing a write current of prescribed magnitude from terminal Wp to terminal Wn or from terminal Wn to terminal Wp. The induced magnetic field generated by the electric current changes the direction of magnetization in the storage layer 5 to either the +X-direction or the −X-direction.

Assuming the magnetization of the pinned layer 3 is fixed to the +X-direction, then the tunnel resistance in the Z-direction of the MTJ 2 takes on a small resistance Rs or a large resistance Rb, depending on whether the direction of magnetization for the storage layer 5 is +X or −X, respectively. The values "0" and "1" are assigned to the respective states of magnetization. A read operation for the MTJ cell, on the other hand, is performed by applying a prescribed voltage across the terminal Wp or Wn and the terminal R and detecting the magnitude of current flowing through the MTJ. A large current determined by a small tunnel resistance (Rs) is detected as a "0", while a small current determined by a large tunnel resistance (Rb) is detected as a "1".

Figure 2:
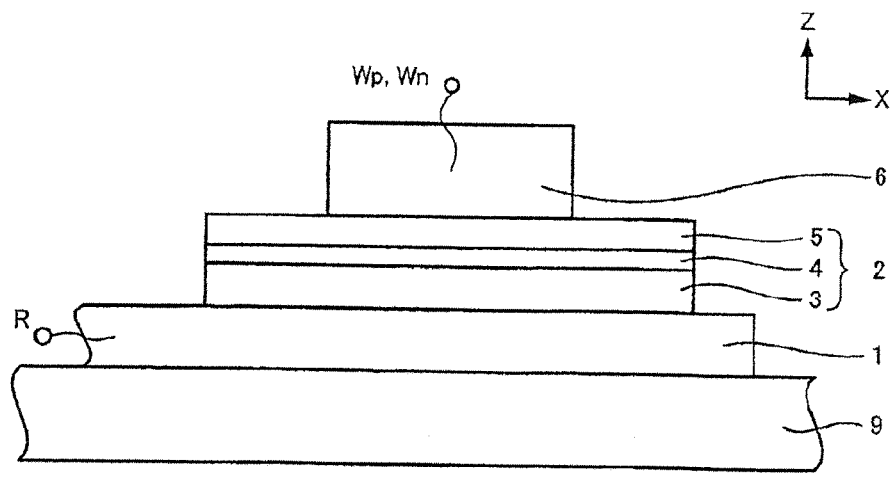
FIG. 2(*a*) is a cross-sectional view taken along the XZ plane of a conventional yoke-less MTJ cell.
Figure 2:
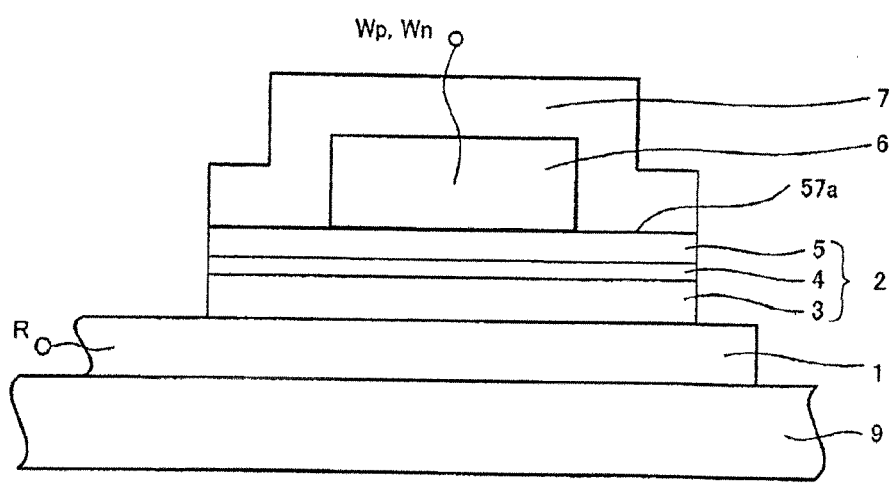
Figure 2:
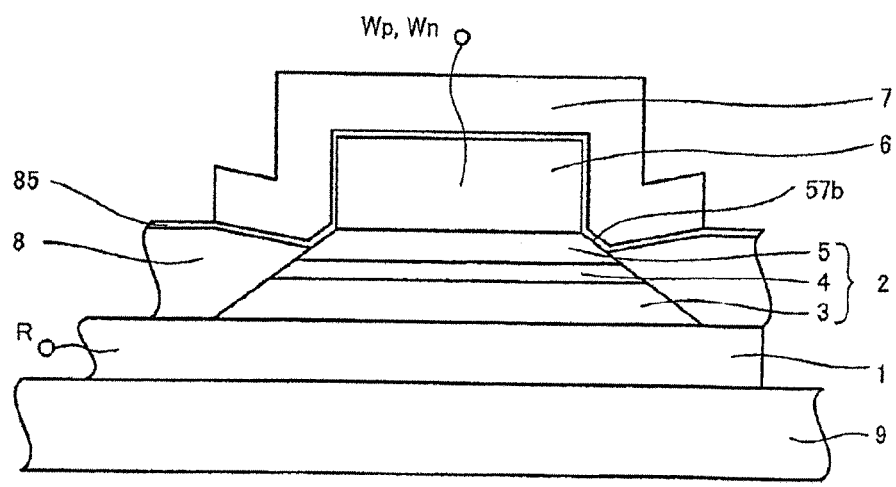

FIG. 2 includes cross-sectional views of various first MTJ cells taken along an XZ plane. FIG. 2(a) shows a conventional yoke-less MTJ cell. FIG. 2(b) shows a conventional yoke-type MTJ cell. FIG. 2(c) shows a yoke-type MTJ cell according to the present invention. Of these diagrams, FIGS. 2(b) and 2(c) correspond to the example in FIG. 1(a) described above.

Figure 3:
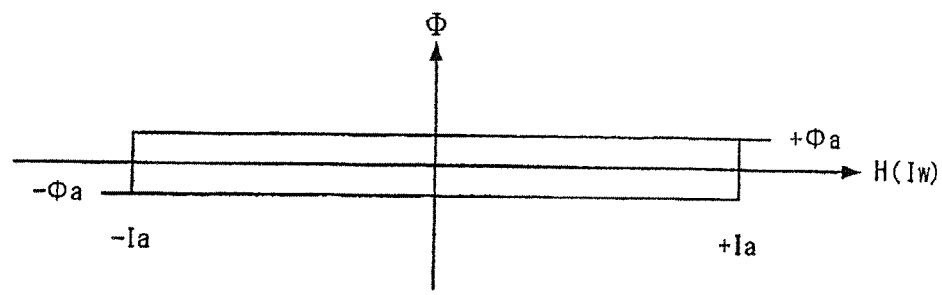
FIGS. 3(*a*), 3(*b*), and 3(*c*) are schematic diagrams illustrating magnetization characteristics of the various MTJ cells in FIG. 2.
Figure 3:
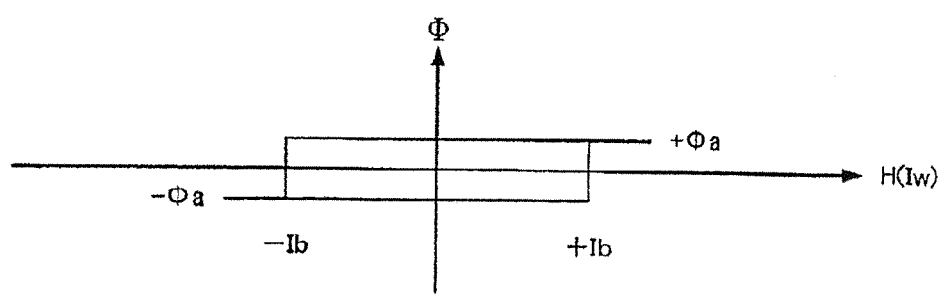
Figure 3:
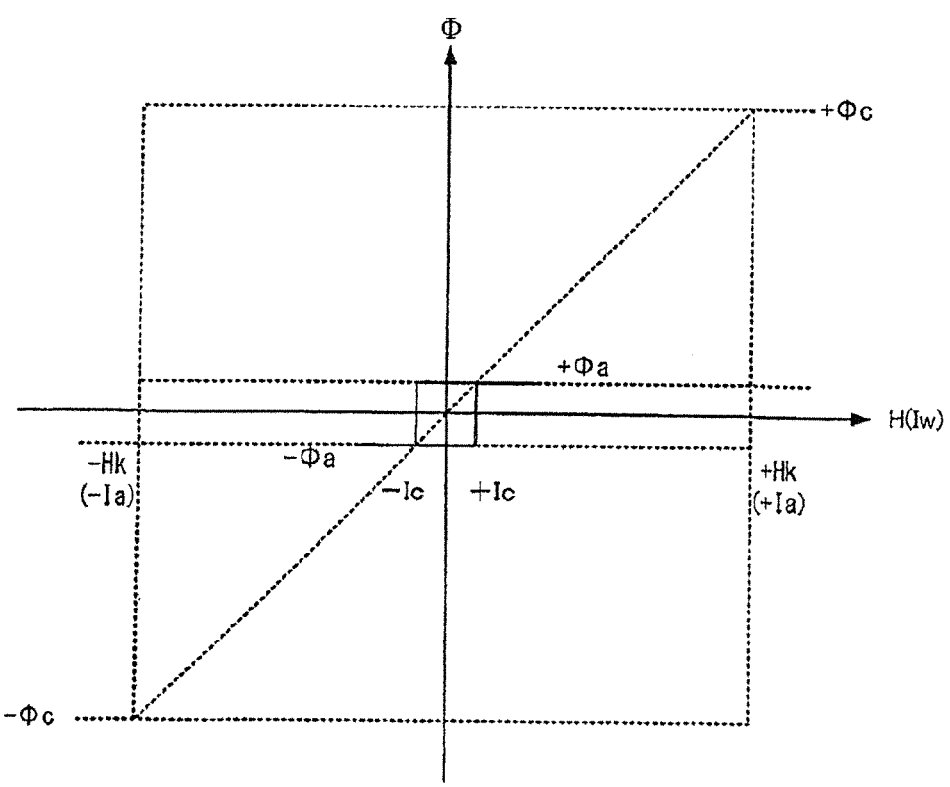

FIG. 3 includes schematic diagrams illustrating magnetization characteristics of the various first MTJ cells in FIG. 2. For the conventional yoke-less MTJ cell shown in FIG. 3(a), the storage layer 5 exhibits rectangular hysteresis characteristics with ±Φa levels of saturation magnetic flux. The magnitude of current required to reverse magnetization, i.e., the write current Ia, is several mA.

For the conventional yoke-type MTJ cell shown in FIG. 3(b), the storage layer 5 again exhibits rectangular hysteresis characteristics similar to those in FIG. 3(a) with ±Φa levels of saturation magnetic flux. Here, the write current Ib needed to reverse magnetization can be lowered to half that of the write current Ia, but is still on the order of a few mA. As described above, the yoke-type MTJ cell can cut the write current in half because the yoke 7 together with the storage layer 5 form a closed loop that essentially encircles all 360 degrees of the second metal layer 6, whereas the storage layer 5 of the yoke-less MTJ cell forms an open path that encircles at most 180 degrees of the second metal layer 6.

The first yoke-type MTJ cell according to the present invention includes the following three structural features. As the first structural feature, the shape of the MTJ in the XY plane, and specifically the shapes of the ferromagnetic pinned layer and ferromagnetic storage layer in the XY plane, has an easy axis of magnetization (hereinafter referred to as "easy axis," "anisotropy," or "axis of anisotropy") in the X-direction, while the shape of the yoke in the XY plane has an easy axis in the Y-direction.

When a magnetic thin film is shaped with major and minor axes, as in a rectangle and pseudo-ellipse, the thin film possesses shape anisotropy along the major axis and, hence, its direction of magnetization lies along the major axis. Further, the thin film can only take on uniaxial anisotropy when the largest dimension of its planar surface is no greater than 1 µm. This condition is believed to be an expression of the quantum nature of magnetization since there are only special states that can exhibit discontinuity. In the present invention, an easy axis of magnetization for thin films whose surface shape is no greater than 1 µm at its largest dimension is defined as the "one quantum easy axis." The pinned layer, storage layer, and yoke in the first MTJ cell according to the present invention are all within 1 µm at their largest dimension. As will be described later in greater detail, the remarkably low write current in the first MTJ cell of the present invention derives from this quantum nature of magnetization and flux return owing to the substantially 360-degree closed magnetic path described above exhibiting flux continuity.

In order to provide the MTJ cell of the preferred embodiment with a quantum easy axis through shape anisotropy, the shape of the MTJ 2 in the XY plane, and specifically the XY planar shapes of the pinned layer 3 and storage layer 5, is rectangular with its long sides aligned in the X-direction, while the XY planar shape of the yoke 7 is rectangular with its long sides aligned in the Y-direction, as shown in FIG. 1(b). Here, the "rectangle" is meant to define a shape having a dominant major axis and is not limited to a quadrilateral having strictly 90-degree interior angles and strictly parallel opposing sides. For example, the MTJ 2 may have the shape of a pseudo-ellipse or a rectangle with rounded corners. Owing to the quantum effects of magnetization described above, the storage layer 5 possesses only one easy axis aligned in the X-direction, while the yoke possesses only one easy axis aligned in the Y-direction.

These characteristics only intensify as the dimensions of the MTJ 2 are reduced. That is, the hysteretic behavior of magnetization shown in FIG. 3(a) for the storage layer alone is even stronger for a magnetic field H applied in the X-direction, while the yoke exhibits stronger non-hysteretic behavior of magnetization as indicated in FIG. 3(c) by the oblique line passing through the origin and the dotted lines for saturation field strength ±Hk. Hence, the shape of the ferromagnetic layer has the effect of aligning the easy axis of magnetization in the X-direction for the pinned layer 3 and storage layer 5 and the y-direction for the yoke 7 by itself. However, in the conventional yoke-type MTJ cell shown in FIG. 2(b), the storage layer 5 has a contact surface 57a contacted by the yoke 7 that is parallel to the easy axis of magnetization (X-direction) of the storage layer 5. The contact surface 57a must have a certain fixed width in order to complete the closed magnetic path and provide sufficient alignment margin for the second metal layer 6. As a result, the easy axis of the yoke 7 is tilted to the X-direction shared by the easy axis of the storage layer 5, regardless of the easy direction of magnetization determined by the shape of the yoke 7 when the yoke 7 is by itself.

Figure 5:
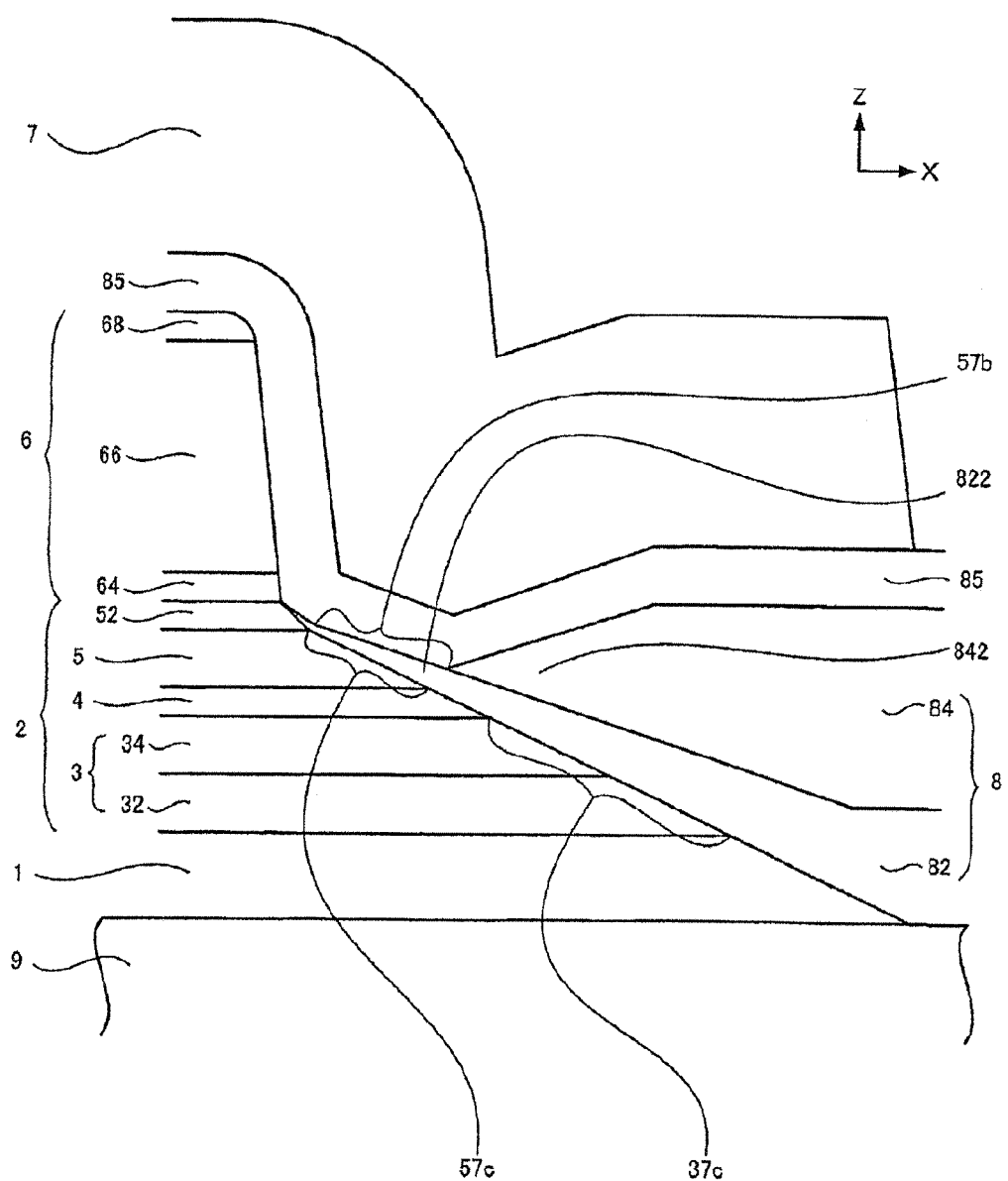
FIG. 5 is a more detailed cross-sectional view taken along the XZ plane of the MTJ cell according to the first embodiment shown in FIG. 2(c)

In contrast, the first yoke-type MTJ cell according to the present invention possesses a relaxed coupling in the joined areas of the yoke and storage layer as the second structural feature. As shown in FIGS. 2(c) and 5 described later, the top surface of the MTJ 2 on the extended parts that are not covered by the second metal layer 6 is formed of a sloped surface 57c on the storage layer 5 and a sloped surface 37c on the pinned layer 3 that is continuous with the sloped surface 57c. In addition, a nonmagnetic bird's-beak-shaped insulating layer 8 and a nonmagnetic third insulating layer 85 are interposed between the top surface of the MTJ 2 and the yoke 7 so that at least the sloped surface 37c of the pinned layer 3 does not directly contact the yoke 7. This structure maintains the easy axis of magnetization for the yoke 7 in the Y-direction determined by shape anisotropy rather than tilting the easy axis to the X-direction aligned with the easy axes of the storage layer 5 and pinned layer 3.

In other words, the insulating layer 8 and third insulating layer 85 are formed over the sloped surface 57c of the storage layer 5 as a relaxed coupling between the storage layer 5 and yoke 7. The insulating layer 8 includes a nonmagnetic first insulating layer 82, and a nonmagnetic second insulating layer 84 formed on top of the first insulating layer 82. The tip of a first bird's beak 822 formed on an end of the first insulating layer 82 reaches the sloped surface 57c of the storage layer 5, while the top of a second bird's beak 842 formed on an end of the second insulating layer 84 does not reach a position above the sloped surface 57c of the storage layer 5. Hence, the first insulating layer 82 has a portion 57b above the sloped surface 57c that is not covered by the second insulating layer 84. Magnetic coupling between the storage layer 5 and yoke 7 is allowed at this portion 57b, while the third insulating layer 85 and first insulating layer 82 relaxes the coupling. The second insulating layer 84 prevents the easy axis of the yoke 7 from tilting due to the effect of the residual pinned layer around eaves described later.

As will be described later, inclined sputtering, for example, may be performed using the second metal layer 6 as a mask to form the sloped structure of the MTJ 2 so as to be microscopic and uniform through self-alignment and have an optimal length and angle of inclination. This relaxed coupling achieves continuity of flux return through the substantially 360-degree closed magnetic path, with neither the storage layer nor yoke losing their quantum nature. Note that if magnetic coupling is excessively weak, the closed magnetic path within the yoke and storage layer will not be completed, interrupting continuity in flux return. As a result, the write current cannot be sufficiently lowered. If coupling is excessively strong, on the other hand, the quantum easy axis of the yoke orthogonal to the easy axis of the storage layer may be drawn to rotate toward the latter easy axis, canceling the remarkable effect of the yoke.

When a write current Iw is applied to the second metal layer 6, the magnetic field induced by the write current Iw is applied to the yoke 7 in the X-direction, which is orthogonal to the Y-axis, i.e., the easy axis of magnetization in the yoke 7. In this case, the magnetization characteristics of the yoke 7 are linear, with saturation flux of $\pm\Phi c$, as shown in FIG. 3(c). The ratio of saturation flux for the storage layer 5 and yoke 7 ($\Phi a/\Phi c$) is equivalent to the ratio of their YZ cross-sectional area and, hence, approximately equivalent to the ratio of their thickness (the dimension in the Z-direction), since the widths of the storage layer 5 and yoke 7 (dimension in the Y-direction) are generally equivalent, as illustrated in FIG. 1(b). Since the storage layer 5 and yoke 7 form a closed magnetic path, the magnetic flux $\Phi$ of the yoke 7 grows linearly as the write current Iw increases. When $\Phi=\Phi a$ at Iw=Ic (magnetization-reversal current), magnetization of the storage layer 5 reverses and its flux is locked at $\Phi a$. Ultimately, Ic/Ia is equivalent to <cross-sectional area of storage layer 5>/<cross-sectional area of yoke 7>. By setting the cross-sectional area (thickness) of the yoke 7 significantly larger than the cross-sectional area of the storage layer 5, the write current can be dramatically reduced by an amount equivalent to this ratio of areas. This arrangement is the third structural feature of the MTJ 2. Accordingly, the yoke of the present invention effects a reduction in write current not found in conventional analyses of magnetic fields, but that can be understood from the quantum effect manifested in a magnetic thin film by its quantum easy axis.

Next, the second feature mentioned above will be described in greater detail. To achieve the second feature of a relaxed coupling, it is most critical that the bottom surface of the yoke 7 does not contact the pinned layer 3, but contacts only the sloped surface 57c of the storage layer 5 through a suitable nonmagnetic insulating layer and, moreover, within a restricted dimensional range in the X-direction.

When the sloped surface 57c of the storage layer 5 is formed with an inclination angle approaching 0 degrees, i.e., near the horizontal, in order to ensure that the bottom surface of the yoke 7 does not contact the pinned layer 3, the easy axis of magnetization of the yoke 7 switches to the X-direction, aligned with the easy axis of the storage layer 5, if the area of contact between the bottom surface of the yoke 7 and the storage layer 5 (the width of the contact region in the X-direction) is large. Conversely, if the area of contact between the bottom surface of the yoke 7 and the storage layer 5 is small, continuity of flux return cannot be maintained with the yoke 7 and storage layer 5. In the conventional technology, the width of the contact area in the X-direction has minimum and maximum values related to the precision of mask alignment for the yoke 7 relative to the second metal layer 6. This presents fabrication difficulties in keeping the width of the contact area in the X-direction within these upper and lower limits, both on the left and right sides of the diagram.

Further, giving the yoke an excessive magnitude of anisotropy in the Y-direction, i.e., increasing the aspect ratio Ar of the yoke, will increase the saturation field strength Hk, shown in FIG. 3(c), reducing the slope of the yoke's linear magnetization characteristics. As a result, the write current Iw increases proportionate to the Hk, as shown by the widening Iw in the top of FIG. 7(a) described later, interfering with the effects of the yoke. In addition to using the effects of shape, described above, this type of Y-direction anisotropy can be induced through deposition under a magnetic field or inclusion of an antiferromagnetic film.

Figure 4:
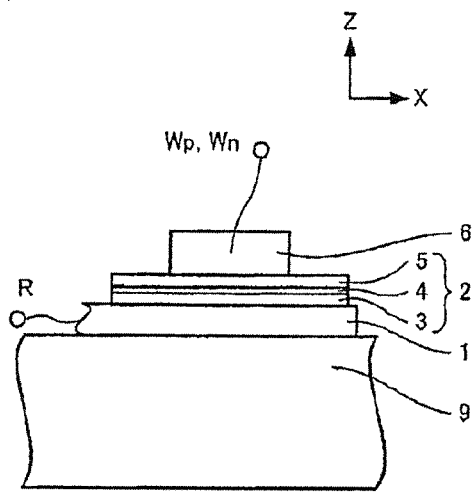
FIG. 4(*a*) is a cross-sectional view taken along the XZ plane, illustrating the process of fabricating the storage layer according to the first embodiment at the stage in the process after forming the three layers of the MTJ and the second metal layer on top thereof.
Figure 4:
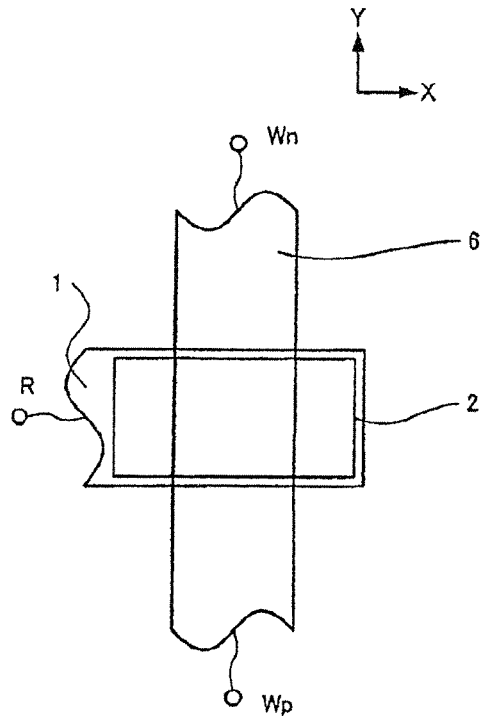
Figure 4:
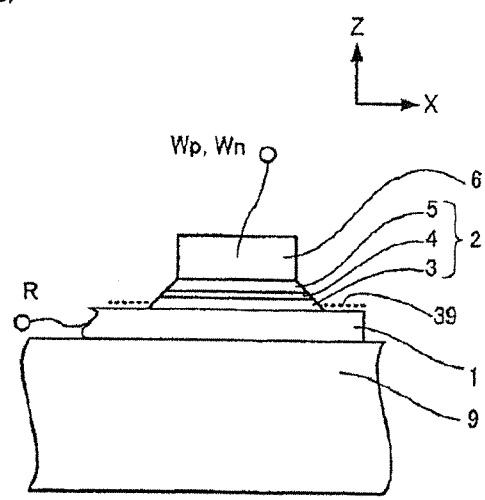
Figure 4:
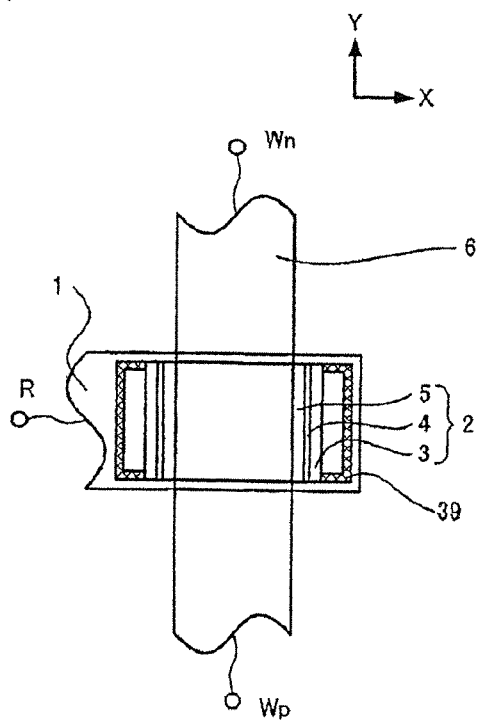

The storage layer should be precisely rectangular in shape in order to obtain uniform properties with the coupling surface of the yoke. Next, steps in the fabrication process involving formation of the storage layer in a precise rectangle will be described in detail with reference to FIG. 4. FIGS. 4(a) and 4(b) illustrate the stage in the process after forming the three layers of the MTJ and forming the second metal layer 6 on the top thereof. FIGS. 4(c) and 4(d) show the stage in the process after forming the three-layered structure of the MTJ 2 using the second metal layer 6 as a mask and prior to forming the yoke 7. FIGS. 4(a) and 4(c) are cross-sectional views taken along an XZ plane and viewed in the Y-direction, while FIGS. 4(b) and 4(d) are transparent views of the XY plane from a perspective in the Z-direction.

According to the preferred embodiment, first the three layers of the MTJ 2 are formed in strips having sufficient margin on both sides of the second metal layer 6 relative to the X-direction, as illustrated in FIGS. 4(a) and 4(b). Subsequently, the second metal layer 6 is used as a mask to form the sloped surfaces described above, and a milling process is performed to remove the three layers of the MTJ 2 including the pinned layer 3 on top of the flat surface that extends from the sloped surface. While these milling steps formed the MTJ 2 in an almost perfectly rectangular shape, it is difficult to remove the pinned layer 3 under or near eaves of the refilled oxide layer for planarization. Consequently, a residual pinned layer 39 having an antiferromagnetic layer and a ferromagnetic layer is left under or along the eaves and forms a square U-shape along the borders of the first metal layer 1, as shown in FIG. 4(d), generating a strong magnetic field in the X-direction.

Strong X-direction anisotropy is induced when the yoke 7 is formed over the top of the above structure. To compensate for this, it is necessary to increase the Y-direction anisotropy in the yoke 7, but this increases the saturation field strength Hk and, hence, causing an increase in the write current Iw. On the other hand, this precise rectangular shape becomes even more essential when the MTJ 2 is down-sized. The effect that the residual pinned layer 39 has on the anisotropy of the yoke 7 decreases sharply as the two components are separated. Thus, in order to separate the bottom surface of the yoke 7 from the pinned layer 3, the nonmagnetic bird's-beak second insulating layer 84 must be interposed between the two, as illustrated in FIG. 2(c).

FIG. 5 is a more detailed view of the structure in FIG. 2(c), showing a cross-section of the first MTJ cell according to the preferred embodiment along an XZ plane viewed in the Y-direction. As shown in FIG. 5, the insulating layer 8 is configured of the first insulating layer 82, second insulating layer 84, and third insulating layer 85 stacked from bottom to top. During actual fabrication, the tip of the first bird's beak 822 constituting the first insulating layer 82 may be formed all the way to the sloped surface 57c of the storage layer 5 in order to ensure that the first bird's beak 822 covers the sloped surface 37c of the pinned layer 3.

Interposed between the yoke 7 and the sloped surface 57c of the storage layer 5 in this way, the nonmagnetic insulating first bird's beak 822 and third insulating layer 85 produce a relaxation phenomenon in the magnetic coupling. While this increases the magnetization-reversal current (write current), it has been found to be effective in maintaining the quantum easy axis. The specifications of the storage layer according to the preferred embodiment allows for the addition of a third insulating layer 85 of about 10 nm thick.

Figure 6:
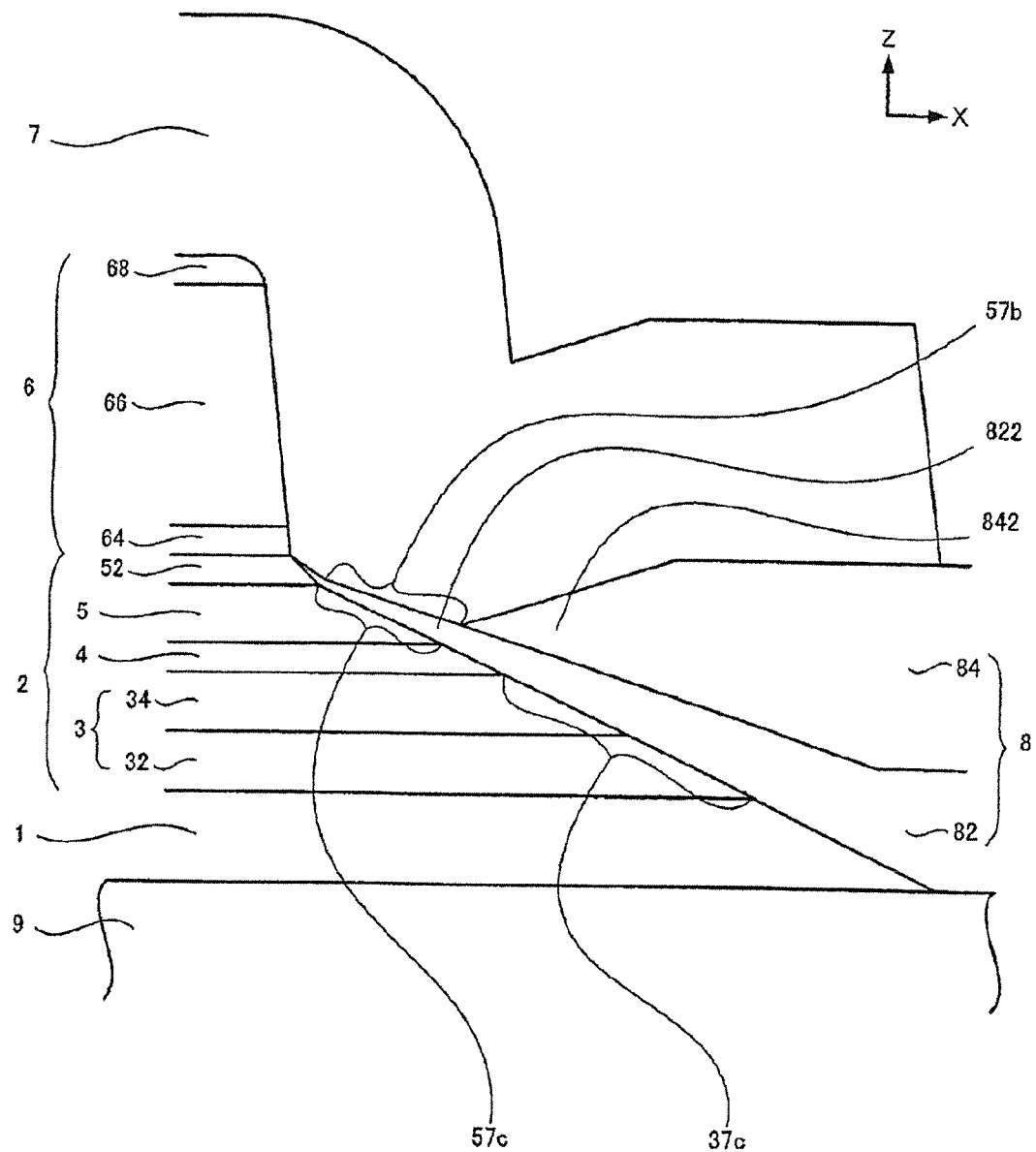
FIG. 6 is a cross-sectional view taken along the XZ plane, showing a variation of the MTJ cell according to the first embodiment shown in FIG. 5.

FIG. 6 is a cross-sectional view along an XZ plane of the first MTJ cell according to the preferred embodiment, illustrating a variation of the structure in FIG. 5. In this variation, the third insulating layer 85 has been omitted from the structure shown in FIG. 5 with the purpose of lessening the relaxation effect on the magnetic coupling as the quantum nature of the MTJ increases due to its smaller size. A further decrease in write current is observed with the stronger coupling. Hence, this structure can fully exploit elements as they continue to be down-sized according to scaling theory.

Further, when the alignment precision is improved for precisely forming the second bird's beak 842 of the second insulating layer 84 at a position that covers only the sloped surface 37c of the pinned layer 3 and not the sloped surface 57c of the storage layer 5, there will no longer be a need to form the first insulating layer 82 having the first bird's beak 822 since direct coupling between the storage layer 5 and yoke 7 is possible. This can be thought of as the maximum coupling of flux continuity.

First Example

First MTJ Cell

The following is a specific example of the first MTJ cell according to the first embodiment described above and will be described with reference to FIG. 5 (cross-sectional view) and 1 (plan views).

The substrate 9 is a silicon wafer whose top surface is coated with a silicon dioxide layer.

The first metal layer 1 is a nonmagnetic metal layer of a tantalum-ruthenium (TaRu) alloy or the like formed in a sputtering process. The first metal layer 1 is patterned on the substrate 9 in a rectangular shape with extended margins in the X-direction, as shown in FIG. 1(b). One end of the first metal layer 1 constitutes the lead wire of terminal R.

The MTJ 2 is formed of the pinned layer 3, barrier layer 4, and storage layer 5, all of which are patterned only on the first metal layer 1.

The pinned layer 3 includes an antiferromagnetic layer 32 and a ferromagnetic layer 34 that configure a synthetic pin structure. The ferromagnetic layer 34 is formed in three layers, including a cobalt-iron (CoFe) layer, an Ru layer, and another CoFe layer.

The barrier layer 4 is also called a tunnel layer or tunnel barrier layer and is formed of magnesium oxide (MgO) in a sputtering process.

The storage layer 5 is also called a free layer and is a layer of Permalloy having a thickness of 5 nm, for example. The storage layer 5 also includes a storage layer cap 52.

The second metal layer 6 is configured of a bottom cap 64 formed of a metal layer; a primary metal layer 66 formed of gold-copper (AuCu) alloy, for example, at a thickness of 30 nm; and a top cap 68 formed of a metal layer. The second metal layer 6 is formed in a rectangular shape with extended margins in the Y-direction, as shown in FIG. 1(b). Both ends of the second metal layer 6 serve as lead wires for terminals Wp and Wn, respectively.

The storage layer cap 52, bottom cap 64, and top cap 68 are designed to prevent atoms of the primary material from scattering to other layers.

After all layers of the MTJ 2 have been formed, a patterning process is performed using the second metal layer 6 as a mask to remove portions of the MTJ 2 exposed on both sides of the second metal layer 6 in the X-direction. Consequently, the lengths of the sides of the MTJ 2 aligned in the X-direction and Y-direction are respectively determined by the width of the second metal layer 6 (dimension in the X-direction) and width of the first metal layer 1 (dimension in the Y-direction), as illustrated in FIG. 1(b). Hence, by setting the width of the second metal layer 6 greater than the width of the first metal layer 1, the MTJ 2 is formed with a rectangular planar shape whose long sides are aligned in the X-direction, as described above.

The MTJ 2 is patterned according to a dry-etching method. Here, ion milling is employed. As shown in FIGS. 5 and 6, the sides of layers constituting the MTJ 2 and first metal layer 1 in the X-direction are formed into sloped surfaces that include the sloped surface 57c of the storage layer 5 and sloped surface 37c of the pinned layer 3. The sloped surfaces are set to an inclination angle of between 20 and 50 degrees. The angle of inclination is adjusted according to the angle of incidence set during ion milling.

Next, the first insulating layers 82 are formed by coating the sloped surfaces of the MTJ 2 and first metal layer 1 with an oxide layer. The first insulating layers 82 are formed by inclined sputtering using an angle of inclination to the Z-axis of 30 degrees or less. Instead of the sputtering method used in the preferred embodiment, the first insulating layers 82 may also be formed according to chemical vapor deposition (CVD) or another method of deposition.

The second insulating layer 84 is formed next by coating the first insulating layer 82 with an additional oxide layer. When depositing the second insulating layer 84 through sputtering, the ion-incident angle is controlled so that the second bird's beak 842 is formed without covering the portion 57b of the first insulating layer 82 above the sloped surface 57c of the storage layer 5. The third insulating layer 85 is formed over the top of this structure according to isotropic sputtering.

Next, the yoke 7 is formed as a Permalloy layer having a thickness of 70 nm, for example, through a sputtering process. The yoke 7 is patterned so as to span the second metal layer 6 and cover the MTJ 2. In the preferred embodiment, the yoke 7 is formed in a rectangular shape whose sides aligned in the Y-direction are longer than the sides aligned in the X-direction. As an alternative method of aligning the quantum easy axis of the yoke 7, an antiferromagnetic layer may be formed on top of the yoke to orient the easy axis of magnetization in the yoke along the Y-direction. The easy axis of magnetization in the yoke can also be oriented in the Y-direction by providing a hard magnet or other magnetically hard film on each side of the yoke positioned within an XY plane.

First Experiment

First MTJ Cell

The following are some specific experiment results for the first MTJ cell according to the first embodiment described above. In this experiment, changes in the write current were observed while varying the aspect ratio of the yoke 7 (<length of side in Y-direction>/<length of side in X-direction>). In particular, the effectiveness of the second insulating layer 84 was examined by comparing cases in which the second insulating layer 84 was present and absent.

Figure 7:
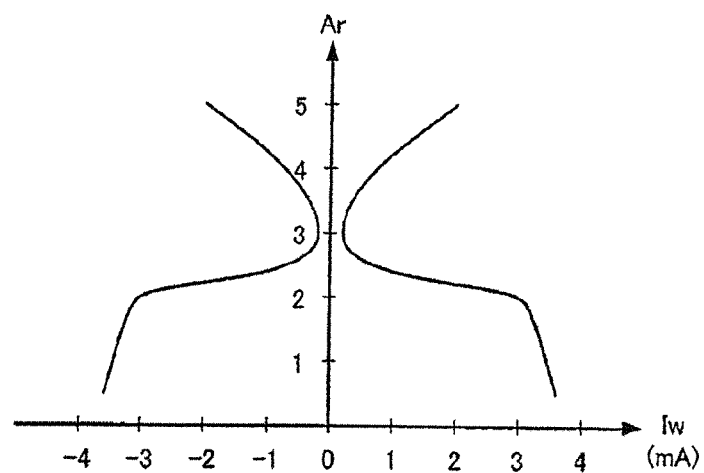
FIG. 7(a) is a graph showing the write current Iw measured in the MTJ cell according to the first embodiment when the second insulating layer was absent.
FIG. 7(b) is a graph showing the measured write current Iw when the second insulating layer was present.
Figure 7:
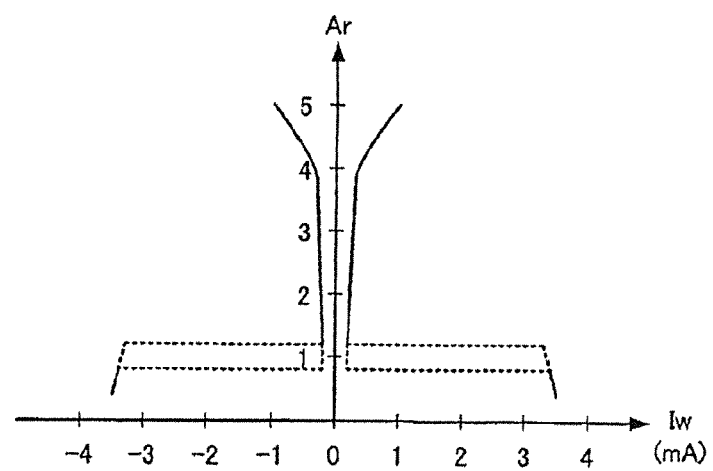

For the experiment, the planar dimensions of the MTJ 2 were fixed at 150 nm (X)×100 nm (Y) for an aspect ratio of 1.5. The side length of the yoke 7 in the X-direction was fixed at 200 nm, while the side length in the Y-direction was varied over the range 100-1000 nm for aspect ratios Ar between 0.5 and 5. FIG. 7 shows the write current Iw measured for each aspect ratio Ar, with FIG. 7(*a*) showing cases in which the second insulating layer 84 is absent and FIG. 7(*b*) showing cases in which the second insulating layer 84 is present.

In both graphs, the write current is large both when the aspect ratio Ar of the yoke 7 is small and when the aspect ratio Ar is large, and is small in the middle regions. However, the range of very small write currents in FIG. 7(*a*) (when the second insulating layer 84 is absent) is restricted to the area around Ar=3, while the smallest write currents in FIG. 7(*b*) (when the second insulating layer 84 is present) are stable over the range Ar=1-3, demonstrating the effect of the second insulating layer 84.

Experiment results for the second insulating layer 84 shown in FIG. 7(*b*), in particular, demonstrate that the write current Iw required for aspect ratios in the middle area (Ar=1-3) drops to 0.15-0.1 mA, corresponding to the inverse ratio of the YZ cross-sectional areas of the storage layer 5 and yoke 7, compared to the largest write current Iw of 3.6 mA required when the aspect ratio is small (Ar=0.5). Further, simulations performed for the variation shown in FIG. 6 described above yielded a result of 50 μA.

First Embodiment

First MRAM Device

Figure 8:
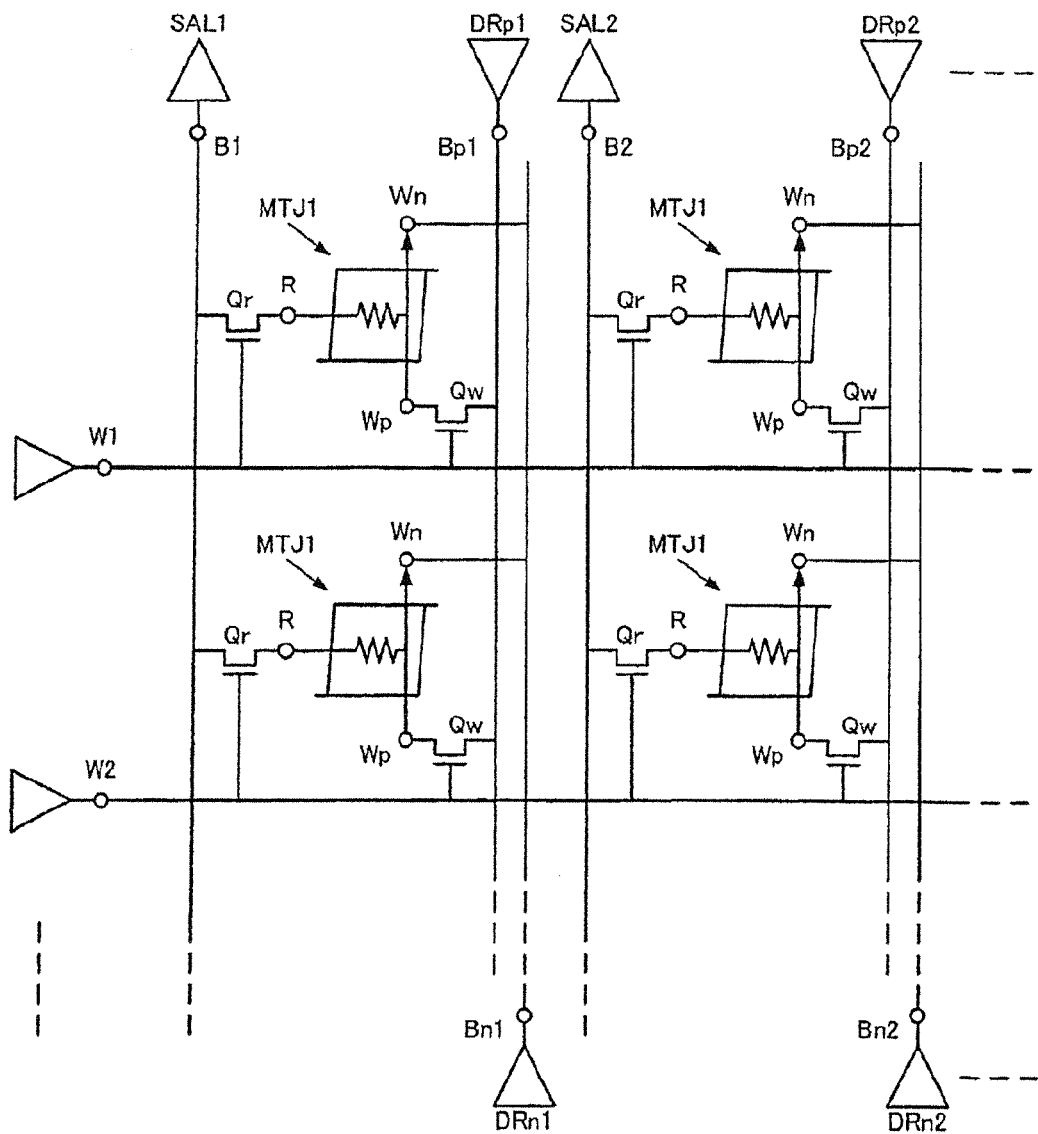
FIG. 8 is a block circuit diagram showing an equivalent circuit for a first MRAM device employing a plurality of the MTJ cells according to the first embodiment and suited to higher integration.

FIG. 8 is a block circuit diagram showing an equivalent circuit for a first MRAM device. The first MRAM device has a plurality of first MTJ cells according to the first embodiment described above and is suited to higher integration. As shown in FIG. 8, the first MRAM device includes a plurality of MRAM cells in an array-like arrangement of rows (hereinafter also called "words") and columns (hereinafter also called "bits"). Each MRAM cell is configured of a first MTJ cell and transistors Qw and Qr whose respective source and drain are connected to terminal Wp and terminal R of the first MTJ cell. The gates of the transistors Qw and Qr are connected to a word line Wi (i=1, 2, . . . ). The drain of the transistor Qw and source of the transistor Qr are connected to a first write bit line Bpj and a read bit line Bj (j=1, 2, . . . ), respectively. Terminal Wn of the first MTJ cell is connected to a second write bit line Bnj (j=1, 2, . . . ).

When forming the first MTJ cell on the substrate 9 as described above, the terminals Wp, R, and Wn are respectively connected to the source of the transistor Qw, drain of the transistor Qr, and second write bit line Bnj implanted in the substrate body through vias (contacts) provided in the silicon substrate. The word lines Wi, read bit lines Bj, first and second write bit lines Bpj and Bnj, and all remaining circuits including peripheral circuits connected to the word line Wi, read bit line Bj, and first and second write bit lines Bpj and Bnj can be produced in the silicon substrate body through standard CMOS processes, for example. Alternatively, rather than being implanted in the silicon substrate body, all or some of the first and second write bit lines Bpj and Bnj, the read bit lines Bj, and the word lines Wi can be formed above the first MTJ cell array with a suitable insulating layer formed therebetween.

In the structure of FIG. 8, MRAM cells of a single $i^{th}$ row are selected by driving the $i^{th}$ word line Wi at the high level to make the transistors Qw and Qr of the cells conductive. A write operation is performed by supplying the write current Iw to the selected column ($j^{th}$ column) to induce a magnetic field at the intersecting point (i, j) with the $i^{th}$ word line Wi. By applying the write current Iw from the first write bit line Bpj toward the second write bit line Bnj, a "0" is written to the MTJ in the cell at intersecting point (i, j). By applying the write current Iw in the reverse direction, a "1" is written to the MTJ in the cell.

A read operation, on the other hand, is performed by applying a read voltage Vr to either the first write bit line Bpj or second write bit line Bnj of the desired $j^{th}$ column. A tunnel current supplied through the transistor Qw and terminal Wp in the cell at the selected intersecting point (i, j) flows through the MTJ in the cell and is conducted via terminal R to the read bit line Bj. A sense amplifier SALj disposed on one end of the read bit line Bj detects the magnitude of the tunnel current, i.e., whether the storage state is "0" or "1".

While in principle, any of the MTJs shown in FIG. 2 are applicable to the MRAM device of FIG. 8, only the MTJ according to the preferred embodiment shown in FIG. 2(*c*) has a practical application because the write current Iw can be suppressed to about 0.1 mA, as described above.

First Embodiment

Second MRAM Device

Figure 9:
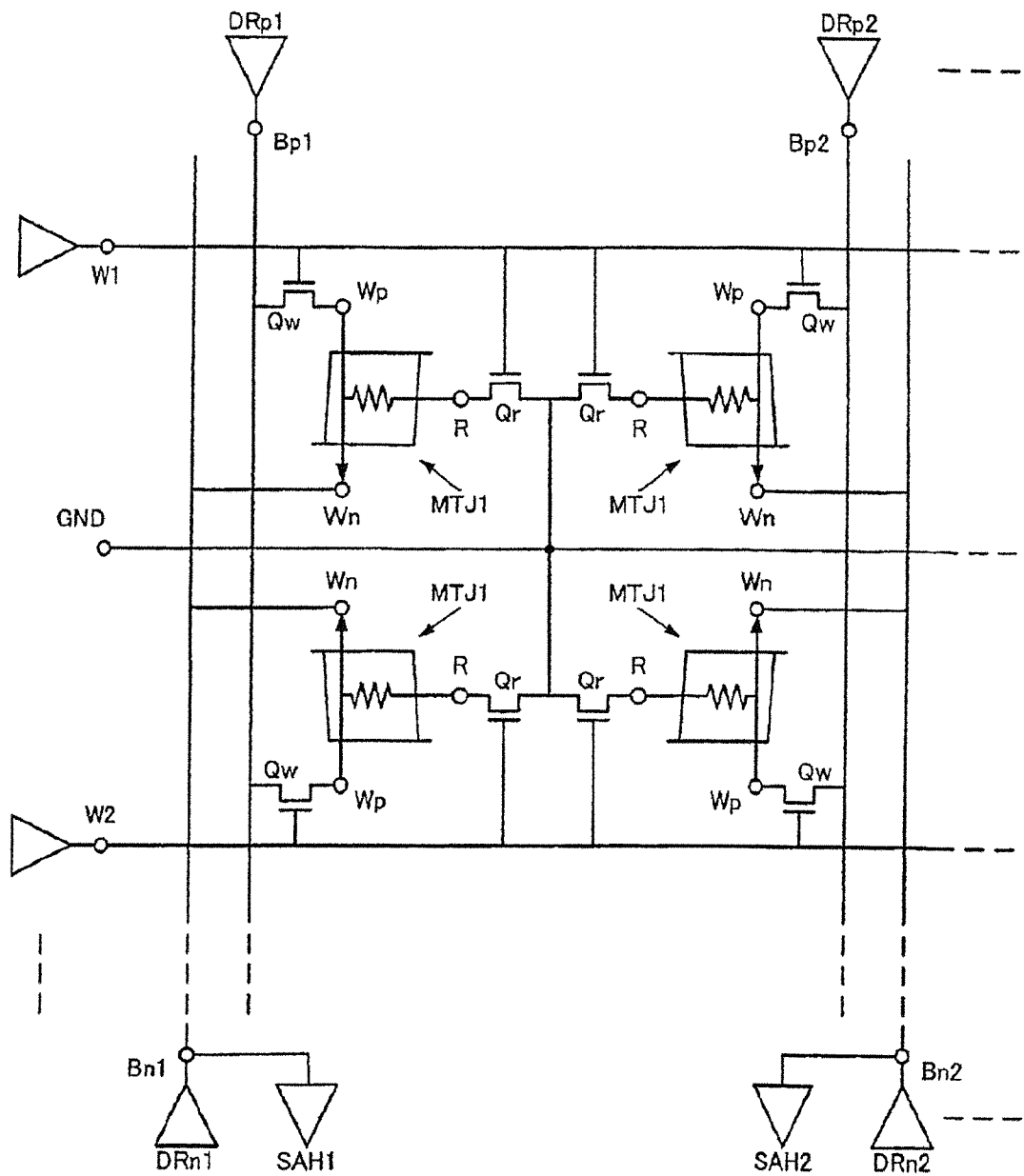
FIG. 9 is a block circuit diagram showing an equivalent circuit for a second MRAM device employing a plurality of the MTJ cells according to the first embodiment and suited to higher integration.

FIG. 9 is a block circuit diagram showing an equivalent circuit for a second MRAM device according to the first embodiment. The second MRAM device employs a plurality of the first MTJ cells according to the first embodiment and is suited to higher integration.

As shown in FIG. 9, each MRAM cell includes a first MTJ cell, and the transistors Qw and Qr whose respective source and drain are connected to the corresponding terminal Wp and terminal R of the first MTJ cell. The gates of the transistors Qw and Qr are connected to the word line Wi (i=1, 2, . . . ). The drain of the transistor Qw and source of the transistor Qr are connected to a first write bit line Bpj (j=1, 2, . . . ) and a ground line GND, respectively. Terminal Wn of the first MTJ cell is connected to the second write bit line Bnj (j=1, 2, . . . ). The ground line GND is common for all MRAM cells and need not be selected for a row direction and/or column direction. However, for purposes of the wiring layout, one ground line GND is provided for every two rows in the preferred embodiment.

When forming the MTJ 2 on the substrate 9 as described above, the terminals Wp, R, and Wn are respectively connected to the source of the transistor Qw, the drain of the transistor Qr, and the second write bit line Bnj implanted in the silicon substrate body through vias (contacts) provided in the substrate. The word lines Wi, ground line GND, and first and second write bit lines Bpj and Bnj, and all remaining circuits including peripheral circuits connected to the word line Wi, and first and second write bit lines Bpj and Bnj can be produced in the silicon substrate body through standard CMOS processes, for example. Alternatively, rather than being implanted in the silicon substrate body, all or some of the first and second write bit lines Bpj and Bnj, the ground lines GND, and the word lines Wi can be formed above the first MTJ cell array with a suitable insulating layer formed therebetween.

In the structure of FIG. 9, MRAM cells of a single $i^{th}$ row are selected by driving the $i^{th}$ word line Wi at the high level to make the transistors Qw and Qr of the cells conductive. A write operation is performed by providing the write current Iw to the selected column ($j^{th}$ column) to induce a magnetic field at the intersecting point (i, j) with the $i^{th}$ word line Wi. By applying the write current Iw from the first write bit line Bpj toward the second write bit line Bnj, a "0" is written to the MTJ in the MRAM cell at intersecting point (i, j). By applying the write current Iw in the reverse direction, a "1" is written to the MTJ in the cell.

A read operation, on the other hand, is performed for the selected column ($j^{th}$ column) by conducting a tunnel current through the MTJ of the cell at the selected intersecting point (i, j) to the ground line GND via the transistor Qr and terminal R. A sense amplifier SAHj provided on the second write bit line Bnj detects the magnitude of the tunnel current, i.e., "0" or "1". Although they are provided on the second write bit lines Bnj in the example of FIG. 9, the sense amplifiers SAHj may instead be provided on the first write bit lines Bpj or may alternate between first and second write bit lines Bpj and Bnj.

While in principle, any of the MTJs shown in FIG. 2 are applicable to the MRAM device of FIG. 9, only the MTJ according to the preferred embodiment shown in FIG. 2(c) has a practical application because the write current Iw can be suppressed to above 0.1 mA, as described above.

Thus, while each cell in the first MRAM device described above requires a total of four wires, including the first and second write bit lines, the read bit line, and the word line, the second MRAM device reduces the number of wires to a total of 3.5, including the first and second write bit lines, the word line, and the ground line shared between neighboring cells. Further, by eliminating the need to select a ground line, the peripheral circuitry can also be reduced.

In the first and second MRAM devices according to the first embodiment described above, the same method is used for applying the write current Iw, but various circuit configurations are possible. In a constant-current writing method, for example, a driver DRpj is provided on one end of the first write bit line Bpj as a constant-current source for supplying a constant current of +Iw or −Iw to the first write bit line Bpj, and a driver DRnj is provided on one end of the second write bit line Bnj as a constant-voltage source for supplying an intermediate voltage. The intermediate voltage is preferably the same as the read voltage Vr.

As a variation of the constant-current writing method, the driver DRpj provided on an end of the first write bit line Bpj serves as a constant-current source that sources a constant current +Iw, and the driver DRnj provided on an end of the second write bit line Bnj serves as a constant-voltage source that sinks voltage to the read voltage Vr, producing a write current +Iw flowing from the first write bit line Bpj to the second write bit line Bnj. Conversely, the driver DRnj serves as a constant-current source that sources a constant current +Iw, while the driver DRpj serves as a constant-voltage source that sinks the voltage to the read voltage Vr, producing a write current −Iw flowing from the second write bit line Bnj to the first write bit line Bpj.

When using these constant-current writing methods, the potential of the first and second write bit lines are maintained essentially at the read voltage Vr during write operations. Accordingly, there is no issue of "write recovery" in this MRAM device, allowing a read operation to be performed immediately after a write operation in the same row.

In a constant-voltage writing method, on the other hand, both the driver DRpj provided on the end of the first write bit line Bpj and the driver DRnj provided on the end of the second write bit line Bnj are switching constant-voltage sources. The drivers DRpj and DRnj respectively supply a high-level voltage VH and low-level voltage VL to produce the write current +Iw, and respectively supply the low-level voltage VL and high-level voltage VH to produce the write current −Iw. At the completion of the write operation, outputs of both drivers DRpj and DRnj return to the read voltage Vr. Here, the voltages VH, Vr, and VL satisfy the relationship VL≤Vr≤VH.

The absolute value of the write current is determined by the drain current of the transistor Qw. However, if the gate voltage of the transistor Qw (high-level voltage across the selected word line Wi) and the drain voltage (high-level voltage VH applied to the first and second write bit lines) are designed so that the transistor Qw operates in saturation, the drain current is essentially determined by the size of the transistor Qw and its gate voltage. Hence, the circuit can be designed to produce a desired constant current Iw. That is, since the transistor Qw is operated as a constant-current source, as with the constant-current writing methods described above, there is no need for a (switching) constant-current source circuit, which is generally more complex than a constant-voltage source circuit.

As a variation of the constant-voltage writing method, the driver DRnj provided on the end of the second write bit line Bnj serves as a constant-voltage source that supplies the read voltage Vr, and the driver DRpj provided on the end of the first write bit line Bpj serves as a switching constant-voltage source that supplies the high-level voltage VH and low-level voltage VL, for example. For symmetry, if Vr=(VH+VL)/2, then the amplitude of the first write bit line can be reduced to half that in the constant-voltage writing method described above.

To avoid saturation of the sense amplifiers and erroneous detection, a ground potential or low voltage equivalent to the input potential of the sense amplifier SALj during a read operation on the first MRAM device is applied to the read bit line Bj after input of the sense amplifier SALj is cut off from the read bit line Bj during a write operation. Further, during a read operation for the first MRAM device, the read voltage Vr is applied to one of the outputs of the drivers DRpj and DRnj respectively provided on the first and second write bit lines, while the other output is cut off.

Similarly, during a write operation on the second MRAM device, the first and second write bit lines Bpj and Bnj are respectively driven as described above after cutting off the input of the sense amplifier SAHj from the first (or second) write bit line Bpj (or Bnj). Further, during a read operation on the second MRAM device, both outputs of the drivers DRpj and DRnj respectively provided on the first and second write bit lines Bpj and Bnj must be cut off while the sense amplifier SAHj supplies the read voltage Vr to the write bit line.

Second Embodiment

Second MTJ cell

Figure 10:
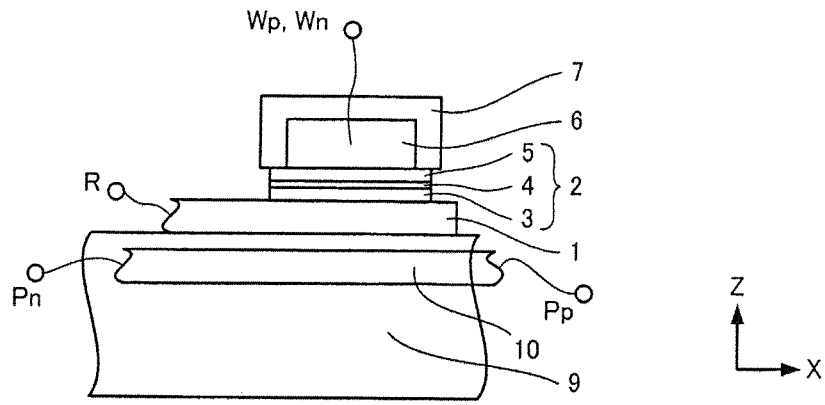
FIG. 10(a) is a cross-sectional view taken along the XZ plane of a second yoke-type MTJ cell employing a yoke-type MTJ according to a second embodiment of the invention.
FIG. 10(b) is a transparent XY plan view of the second yoke-type MTJ cell.
FIG. 10(c) is an abbreviated circuit diagram of the second yoke-type MTJ cell.
Figure 10:
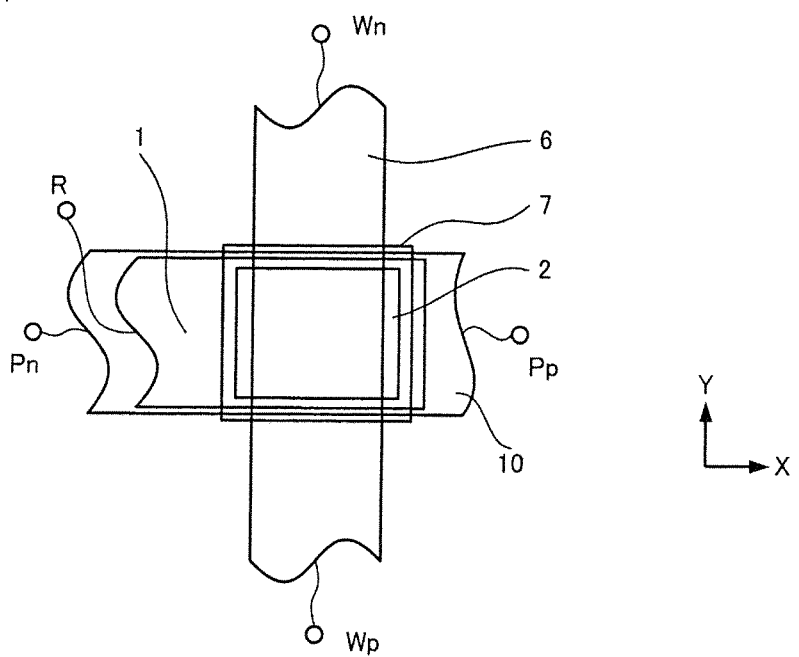
Figure 10:
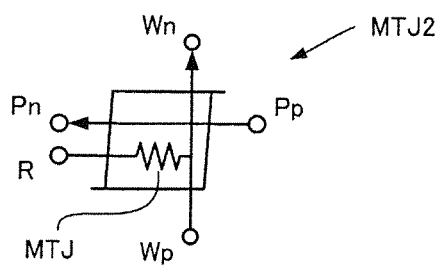

FIG. 10 includes general schematic diagrams of a second yoke-type MTJ cell (hereinafter simply called a "second MTJ cell" and denoted by "MTJ2" in the drawings) employing a yoke-type MTJ according to a second embodiment. FIG. 10(a) is a cross-sectional view of the second MTJ cell showing an XZ plane viewed along the Y-axis. FIG. 10(b) is a transparent XY plan view of the second MTJ cell viewed along the Z-axis. FIG. 10(c) is an abbreviated circuit diagram of the second MTJ cell. In the following description, parts described in the first embodiment are assigned the same reference numerals to avoid duplicating description.

As shown in FIGS. 10(a) and 10(b), the second embodiment differs from the first embodiment (FIG. 1) in two aspects. First, the easy axis of the yoke 7 lies in the X-direction due to the shape effect. That is, the yoke 7 in the second embodiment is rectangular in an XY plane, with its long sides aligned in the X-direction. Second, a third metal layer 10 elongated in the X-direction is provided inside the silicon substrate. Note that the third metal layer 10 is depicted with a width (dimension in the Y-direction) slightly greater than the widths of the first metal layer 1 and MTJ 2, but the third metal layer 10 is not limited to this shape. In addition, the third metal layer 10 may be provided above the yoke 7 rather than inside the substrate 9, as will be described later. In this example, terminals Pp and Pn are respectively added to the ends of the third metal layer 10 in the X-direction.

FIG. 10(c) is an abbreviated circuit diagram of the second yoke-type MTJ cell expressed in terms of the terminals R, Wp, Wn, Pp, and Pn. Since the yoke 7 has a rectangular shape in an XY plane with its long sides aligned in the X-direction, unlike the yoke 7 according to the first embodiment, the easy axis of magnetization in the yoke 7 is aligned in the X-direction, as is the easy axis of magnetization for the storage layer 5, owing to the shape effect. This easy axis may also be induced by providing an antiferromagnetic layer on top of the yoke.

Since a bias current is not applied to the third metal layer 10 during a non-selected state or a read state, the direction of magnetization in the yoke matches that of the storage layer 5, unlike in the first embodiment. Consequently, there is no yoke effect that could permit writes at a low current.

When a prescribed write bias current flows from terminal Pp to terminal Pn in the third metal layer 10, the direction of magnetization in the yoke 7 changes to another quantum direction of magnetization Y orthogonal to the initial X-direction anisotropy. This produces the yoke effect, enabling write operations in the second MTJ cell at a low magnitude of current. More specifically, by passing a write current of prescribed magnitude from terminal Wp to terminal Wn or from terminal Wn to terminal Wp, the resulting induced magnetic field changes the direction of magnetization in the storage layer 5 of the MTJ 2 to the +X-direction or −X-direction, respectively. Changing the direction of magnetization in the yoke 7 to the Y-direction dramatically reduces the write current, as in the first embodiment described above.

Assuming that magnetization in the pinned layer 3 is fixed to the +X-direction, for example, then the tunnel resistance in the Z-direction of the MTJ 2 takes on a small resistance Rs or a large resistance Rb, depending on whether the direction of magnetization in the storage layer 5 is +X or −X, respectively. The values "0" and "1" are assigned to these respective states of magnetization. A read operation for the second MTJ cell, on the other hand, is performed by applying a prescribed voltage across the terminals Wp or Wn and the terminal R and detecting the magnitude of current flowing through the MTJ 2. A large current determined by a small tunnel resistance (Rs) is detected as a "0", while a small current determined by a large tunnel resistance (Rb) is detected as a "1".

The detailed structure of the second MTJ cell according to the second embodiment will not be described here because the structure is identical to the first MTJ cell of the first embodiment, except for the addition of the third metal layer 10, and has already been described with reference to the XZ cross-sectional views of FIGS. 5 and 6. In particular, the sloped surfaces formed on the sides of the MTJ 2 affecting the surfaces of the storage layer 5 that contact the yoke 7 are identical in structure to the sloped surfaces on the sides of the first MTJ cell according to the first embodiment.

The third metal layer 10 may be formed using a common semiconductor technique of providing a metal conductor, such as an aluminum wire having a width of 200 nm and a thickness of 300 nm, at an insulated position near the surface of the substrate 9 or an insulated position near the top of the yoke 7. The third metal layer 10 is preferably cladded with a ferromagnetic layer, such as Permalloy. By providing the ferromagnetic layer so as to cover the metal conductor, excluding the surface of the third metal layer 10 that opposes the yoke 7, the write bias current flowing through the third metal layer 10 induces a strong magnetic field in the ferromagnetic layer that passes through the yoke 7 in the Y-direction. Needless to say, the ferromagnetic layer can reduce the write bias current required to apply a prescribed magnetic field to the yoke 7.

Second Experiment

Second MTJ Cell

The following are some specific experiment results for the MTJ cell according to the second embodiment. In this experiment, changes in the write current were observed while varying the write bias current value flowing in the third metal layer 10 and, hence, the effect of the magnetizing field (in units of Oersted; Oe) induced by this current on the yoke 7. In particular, the effectiveness of the second insulating layer 84 was examined by comparing cases in which the second insulating layer 84 was present and absent.

Figure 11:
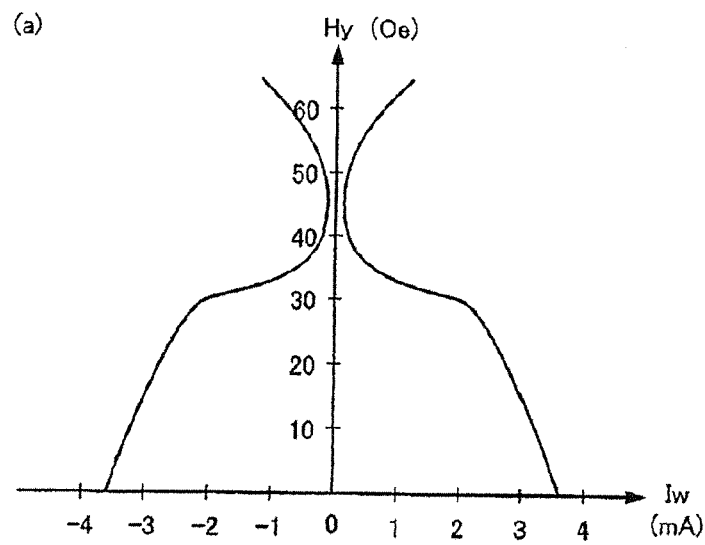
FIG. 11(a) is a graph showing the write current Iw measured in the MTJ cell according to the second embodiment when the second insulating layer was absent.
FIG. 11(b) is a graph showing the measured write current Iw when the second insulating layer was present.
Figure 11:
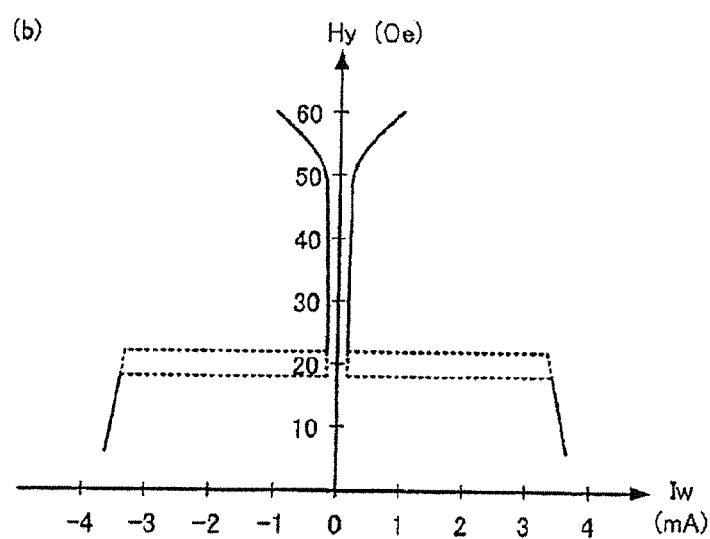

For the experiment, the planar dimensions of the MTJ 2 were fixed at 150 nm (X)×100 nm (Y) for an aspect ratio of 1.5. The planar dimensions of the yoke 7 were fixed at 400 nm (X)×200 nm (Y). The magnetic field strength Hy induced by the write bias current was varied over the range 0-60 Oe, which corresponds to the range 0-3 mA of the write bias current. Since the induced magnetic field is concentrated in the yoke, which has very high magnetic permeability, the value of the magnetic field strength Hy induced by the write bias current Ip is not thought to be acutely dependent on such dimensions as the cross-sectional area of the write bias line, and the distance between the write bias line and the yoke. FIG. 11 shows the write current Iw measured for each induced magnetic field strength Hy, with FIG. 11(a) showing cases in which the second insulating layer 84 is absent and FIG. 11(b) showing cases in which the second insulating layer 84 is present.

In both graphs, the write current is large both when the magnetic field strength Hy of the yoke 7 is small and when the magnetic field strength Hy is large, and is small in the middle region. However, the range of very small write currents in FIG. 11(a) (when the second insulating layer 84 is absent) is restricted to a range smaller than Hy=40-50 Oe, while the range of very small write currents in FIG. 11(b) (when the second insulating layer 84 is present) is stable over the range Hy=25-50 Oe, demonstrating the effect of the second insulating layer 84.

Based on FIGS. 11(a) and 11(b), the experiment demonstrated that the write current Iw required when Hy is optimal drops to 0.10 mA, corresponding to the inverse ratio of the YZ cross-sectional areas of the storage layer 5 and yoke 7, compared to the largest write current Iw of 3.6 mA required when Hy=0. The second MTJ cell features a high half-selection current ratio of 36, where the half-selection current ratio is the ratio of write currents when a bias current is not supplied against when a bias current is supplied.

Second Embodiment

Third MRAM Device

Figure 12:
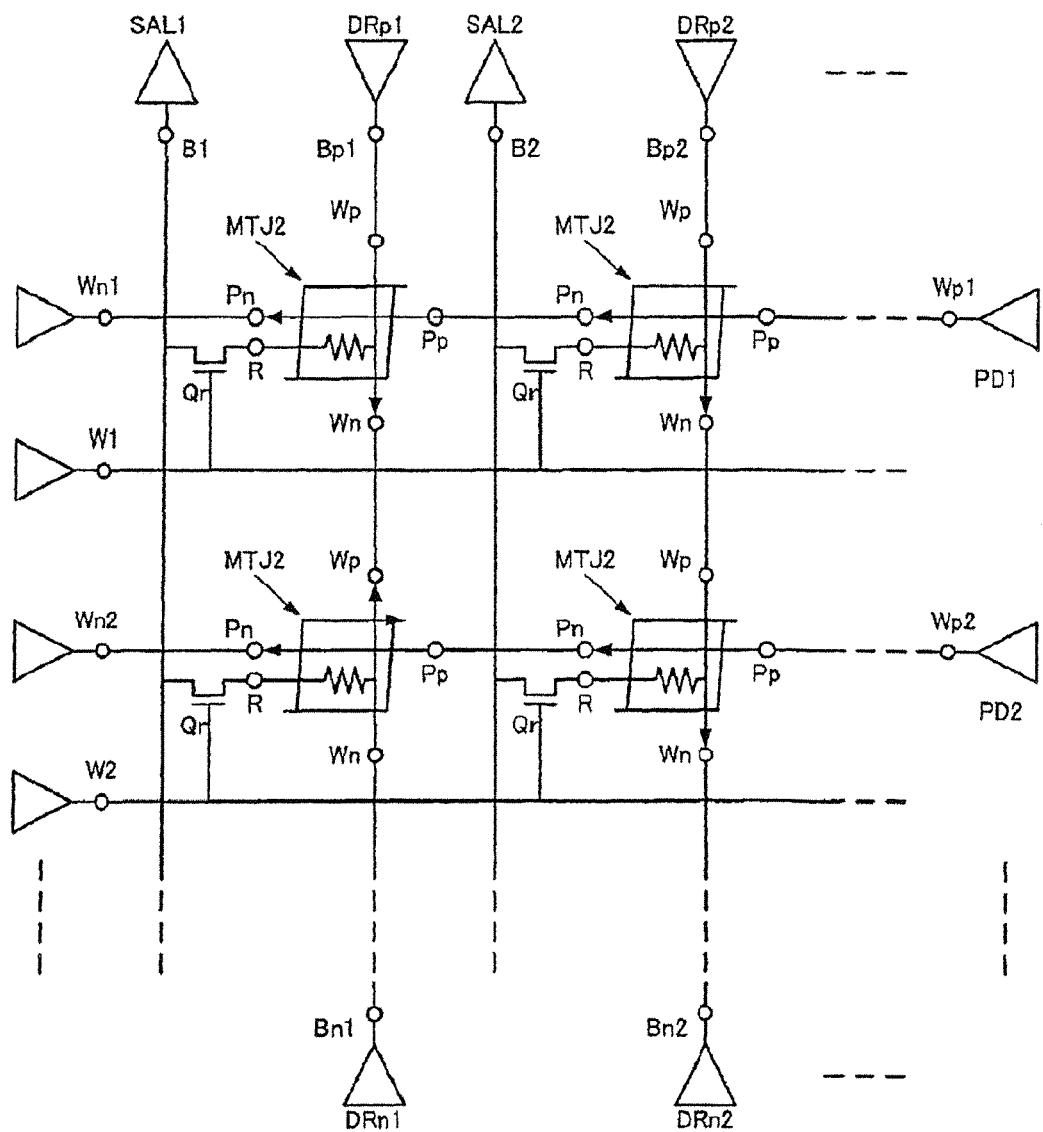
FIG. 12 is a block circuit diagram showing an equivalent circuit for a third MRAM device employing a plurality of the MTJ cells according to the second embodiment and suited to higher integration.

FIG. 12 is a block circuit diagram showing an equivalent circuit for a third MRAM device. The third MRAM device has a plurality of second MTJ cells according to the second embodiment described above and is suited to higher integration. As shown in FIG. 12, each cell of the MRAM device includes a second MTJ cell and a transistor Qr whose drain is connected to the terminal R of the second MTJ cell. The gate of the transistor Qr is connected to the word line Wi (i=1, 2, ... ). The source of the transistor Qr is connected to the read bit line Bj (j=1, 2, ... ). Terminals Wp and Wn of each second MTJ cell are connected in series to terminals Wn and Wp of neighboring second MTJ cells to form a write bit line Bpj-Bnj. Further, rather than physically forming the terminals Pp and Pn in the third metal layer 10 of each MRAM cell, write bias lines Wpi-Wni are formed parallel to the word lines Wi, penetrating the array of cells in the X-direction.

When forming the MTJ 2 on the substrate 9, as described above, the terminals R, Wp, and Wn are connected to the transistor Qr and a write bit line Bpj-Bnj implanted in the silicon substrate body through vias provided in the substrate. The read bit lines Bj, write bias lines Wpi-Wni, and all remaining circuits including peripheral circuits connected to the read bit lines Bj and write bias lines Wpi-Wni can be produced in the silicon substrate through standard CMOS processes, for example. Alternatively, rather than being implanted in the silicon substrate body, all or some of the write bit line Bpj-Bnj, read bit line Bj, and write bias line Wpi-Wni can be formed above the second MTJ cell array with a suitable insulating layer formed therebetween.

With the configuration in FIG. 12, a write operation is performed by applying a prescribed write bias current only to the ith write bias line Wpi-Wni being selected and by applying a prescribed read voltage Vr to the write bit line Bpj-Bnj of the selected column ($j^{th}$ column) to induce a magnetic field at the intersecting point (i, j). By applying the write current Iw from the Bpj end to the Bnj end at this time, a "0" is written in the MTJ cell at the intersecting point (i, j). By applying the write current Iw in the reverse direction, a "1" is written in the MTJ cell. As described above, the magnetic field induced by the write bias current in the selected $i^{th}$ write bias line aligns the easy axis of magnetization in the yoke of the MTJ cells positioned on the $i^{th}$ write bias line in the Y-direction. Hence, this configuration can reduce the write current Iw to about 100 μA, as in the first embodiment described above.

However, since a write bias current is not applied to non-selected write bias lines, i.e., all write bias lines other than the $i^{th}$ write bias line, the quantum anisotropy in the yoke of the non-selected MTJ cells remains oriented in the X-direction. Therefore, the yoke does not produce an effect for reducing the write current Iw. In other words, forcibly writing to a non-selected MTJ cell requires a write current Iw of a few mA. Thus, selectively writing to an MTJ cell positioned at the intersecting point of the write bias current flowing in the X-direction and the write current Iw flowing in the Y-direction can be performed with extremely high selectivity (100 μA against a few mA).

Note that the potential for all word lines Wi is set to a low level that turns off the transistors Qr, regardless of whether an $i^{th}$ row has been selected. This configuration can reduce power consumption since an electric current does not flow through the MTJs. Further, the read voltage Vr continues to be applied to all non-selected write bit lines Bpj-Bnj, minimizing the write recovery time (increasing the read access time for a read cycle immediately following a write cycle).

A read operation, on the other hand, is performed by driving only the selected $i^{th}$ word line Wi at a high level so that the transistors Qr in all MRAM cells of the selected row are made conductive, and by applying the read voltage Vr simultaneously to the write bit line Bpj-Bnj of the selected column ($j^{th}$ column). A resulting tunnel current flowing through the MTJ of the cell at intersecting point (i, j) is conducted to the read bit line Bj via the transistor Qr, and the sense amplifier SALj provided on an end of the read bit line Bj detects the magnitude of the tunnel current, i.e., whether the storage state is "0" or "1".

While in principle, any of the MTJ cells shown in FIG. 2 are applicable to the MRAM device of FIG. 12, only the MTJ according to the preferred embodiment shown in FIG. 2(c) has a practical application because the write current Iw can be suppressed to about 0.1 mA, as described above.

The first MRAM device described above requires four wires, including the first and second write bit lines, the read bit line, and the word line, and two transistors Qw and Qr for each cell. Although the third MRAM device also requires four wires for each cell, including a write bit line, read bit line, word line, and write bias line, two wires are aligned in the X (word) direction and two in the Y (bit) direction for a more balanced layout. Also, the dimension of each cell can be reduced, since each cell requires no vias for the write bias line and only the single transistor Qr. Further, by eliminating the need to select a ground line, the peripheral circuitry can also be reduced.

Second Embodiment

Fourth MRAM Device

Figure 13:
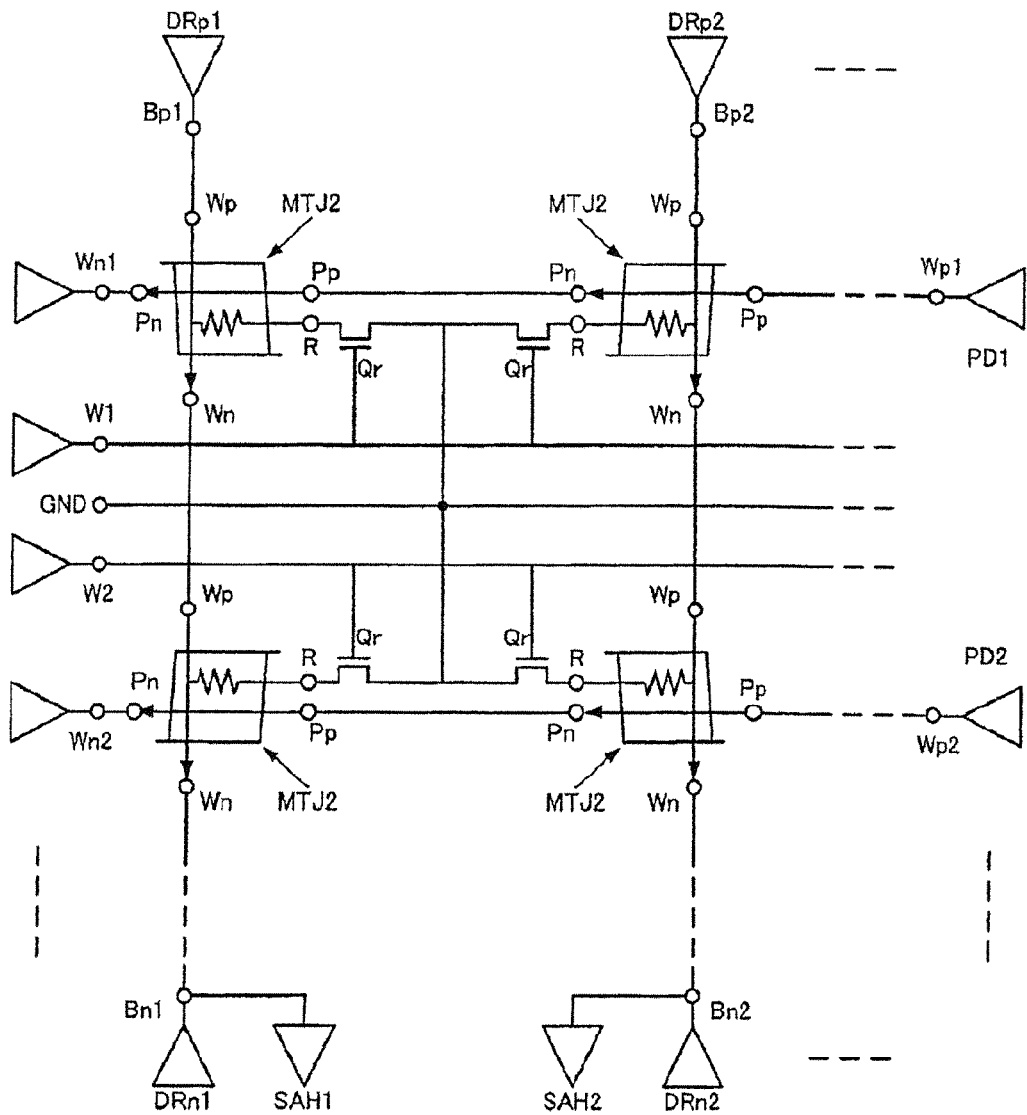
FIG. 13 is a block circuit diagram showing an equivalent circuit for a fourth MRAM device employing a plurality of the MTJ cells according to the second embodiment and suited to higher integration.

FIG. 13 is a block circuit diagram showing an equivalent circuit for a fourth MRAM device according to the second embodiment. The fourth MRAM device employs a plurality of the second MTJ cells according to the second embodiment and is suited to higher integration.

As shown in FIG. 13, each MRAM cell includes a second MTJ cell, and a transistor Qr whose drain is connected to the terminal R of the second MTJ cell. The gate of the transistor Qr is connected to the word line Wi (i=1, 2, ... ). The source of the transistor Qr is connected to a ground line GND. Terminals Wp and Wn of the second MTJ cell are sequentially connected in series to terminals Wn and Wp on second MTJ cells of neighboring cells, forming a write bit line Bpj-Bnj. Further, rather than physically forming the terminals Pp and Pn in the third metal layer 10 of each MRAM cell, write bias lines Wpi-Wni are formed parallel to the word lines Wi, penetrating the array of cells in the X-direction. The ground line GND is common for all MRAM cells and need not be selected for a row direction and/or column direction. However, for purposes of the wiring layout, one ground line GND is provided for every two rows in the preferred embodiment.

When forming the MTJ 2 on the substrate 9, terminals R, Wp, and Wn are connected to the transistor Qr and the write bit line Bpj-Bnj implanted in the substrate body through vias provided in the substrate. The ground line GND, write bias line Wpi-Wni, and all remaining circuits including peripheral circuits connected to the ground line GND and write bias line Wpi-Wni can be produced in the silicon substrate through standard CMOS processes. Alternatively, rather than being implanted in the silicon substrate body, all or some of the write bit line Bpj-Bnj, ground line GND, and write bias line Wpi-Wni can be formed above the second MTJ cell array with a suitable insulating layer formed therebetween.

With the configuration in FIG. 13, a write operation is performed by applying a prescribed write bias current only to the selected ith write bias line Wpi-Wni and by applying the prescribed read voltage Vr to the write bit line Bpj-Bnj of the selected column ($j^{th}$ column) to induce a magnetic field at the intersecting point (i, j). By applying the write current by from the Bpj end to the Bnj end at this time, a "0" is written to the MTJ in the MRAM cell at intersecting point (i, j). By applying the write current by in the reverse direction, a "1" is written to the MTJ in the cell.

As described above, the magnetic field induced by the write bias current in the selected $i^{th}$ write bias line aligns the easy axis of magnetization in the yoke of the MTJ cells positioned on the $i^{th}$ write bias line to the Y-direction. Hence, this configuration can reduce the write current Iw to about 100 μA, as in the first embodiment described above. However, since a write bias current is not applied to non-selected write bias lines, i.e., all write bias lines other than the $i^{th}$ write bias line, the quantum anisotropy in the yoke of the non-selected MTJ cells remains oriented in the X-direction. Therefore, the yoke does not produce an effect for reducing the write current Iw. In other words, forcibly writing to a non-selected MTJ cell requires a write current Iw of a few mA. Thus, selectively writing to an MTJ cell positioned at the intersecting point of the write bias current flowing in the X-direction and the write current Iw flowing in the Y-direction can be performed with extremely high selectivity (100 μA against a few mA).

Note that the potential for all word lines Wi is set to a low level that turns off the transistors Qr, regardless of whether an $i^{th}$ row has been selected. This configuration can reduce power consumption since an electric current does not flow through the MTJs. Further, the read voltage Vr continues to be applied to all non-selected write bit lines Bpj-Bnj, minimizing the write recovery time (increasing the read access time for a read cycle immediately following a write cycle).

A read operation, on the other hand, is performed by driving only the selected $i^{th}$ word line Wi at a high level so that the transistors Qr in all MRAM cells of the selected row are made conductive, and by applying the read voltage Vr simultaneously to the write bit line Bpj-Bnj of the selected column ($j^{th}$ column). A resulting tunnel current flowing through the MTJ of the cell at the selected intersecting point (i, j) is conducted to the ground line GND via the transistor Qr and terminal R, and the sense amplifier SAHj provided on the write bit line Bpj-Bnj detects the magnitude of the tunnel current, i.e., whether the storage state is "0" or "1". Although they are provided on the Bnj end of the write bit line Bpj-Bnj, the sense amplifier SAHj may instead be provided on the Bpj end or may alternate between Bpj and Bnj ends.

While in principle, any of the MTJ cells shown in FIG. 2 are applicable to the MRAM device of FIG. 13, only the MTJ according to the preferred embodiment shown in FIG. 2(c) has a practical application because the write current Iw can be suppressed to about 0.1 mA, as described above.

The second MRAM device described above requires a total of 3.5 wires, including the first and second write bit lines, the ground line shared by neighboring cells, and the word line, and two transistors Qw and Qr for each cell. Although the fourth MRAM device also requires 3.5 wires for each cell, including a write bit line, word line, ground line shared by neighboring cells, and write bias line, the dimension of each cell can be reduced, since each cell requires no vias for the write bias line and only the single transistor Qr. Further, by eliminating the need to select a ground line, the peripheral circuitry can also be reduced.

In the third and fourth MRAM devices according to the second embodiment described above, the same method is used for applying the write current Iw, and the possible circuit configurations are limited exclusively to constant-current writing methods. That is, in the third and fourth MRAM devices, the driver DRpj provided on one end of the write bit line Bpj-Bnj (the Bpj end, for example) serves as a switching constant-current source that supplies a constant current of +Iw or −Iw to the Bpj end, while the driver DRnj provided on the other end of the write bit line Bpj-Bnj (the Bnj end, for example) serves as a constant-voltage source that supplies an intermediate voltage. The intermediate voltage is preferably equivalent to the read voltage Vr. However, to avoid saturation of the sense amplifier SAHj, it is preferable to cut off input during a write operation on the fourth MRAM device.

This method cuts back on the use of decoders by eliminating the need to provide column (j=1, 2, . . . ) decoders on both sides of the cell array. In response to a "1" or "0" in the write data, the current provided by the driver DRpj is switched to either +Iw or −Iw, while the driving role of the driver DRnj is changed to either sink or source.

As a variation of this constant-current writing method, the driver DRpj provided on the Bpj end of the write bit line Bpj-Bnj serves as a constant-current source that sources a constant current +Iw, and the driver DRnj provided on the Bnj end serves as a constant-voltage source that sinks voltage to the read voltage Vr, producing a write current +Iw flowing from the Bpj end to the Bnj end. Conversely, the driver DRnj provided on the Bnj end serves as a constant-current source that sources a constant current +Iw, while the driver DRpj provided on the Bpj end serves as a constant-voltage source that sinks voltage to the read voltage Vr, producing a write current −Iw flowing from the Bnj end to the Bpj end.

When using these constant-current writing methods, the potential of the write bit line Bpj-Bnj is maintained essentially at the read voltage Vr during write operations. Accordingly, there is no issue of write recovery in this MRAM device, allowing a read operation to be performed immediately after a write operation in the same row.

Second Embodiment

Fifth MRAM Device

Figure 14:
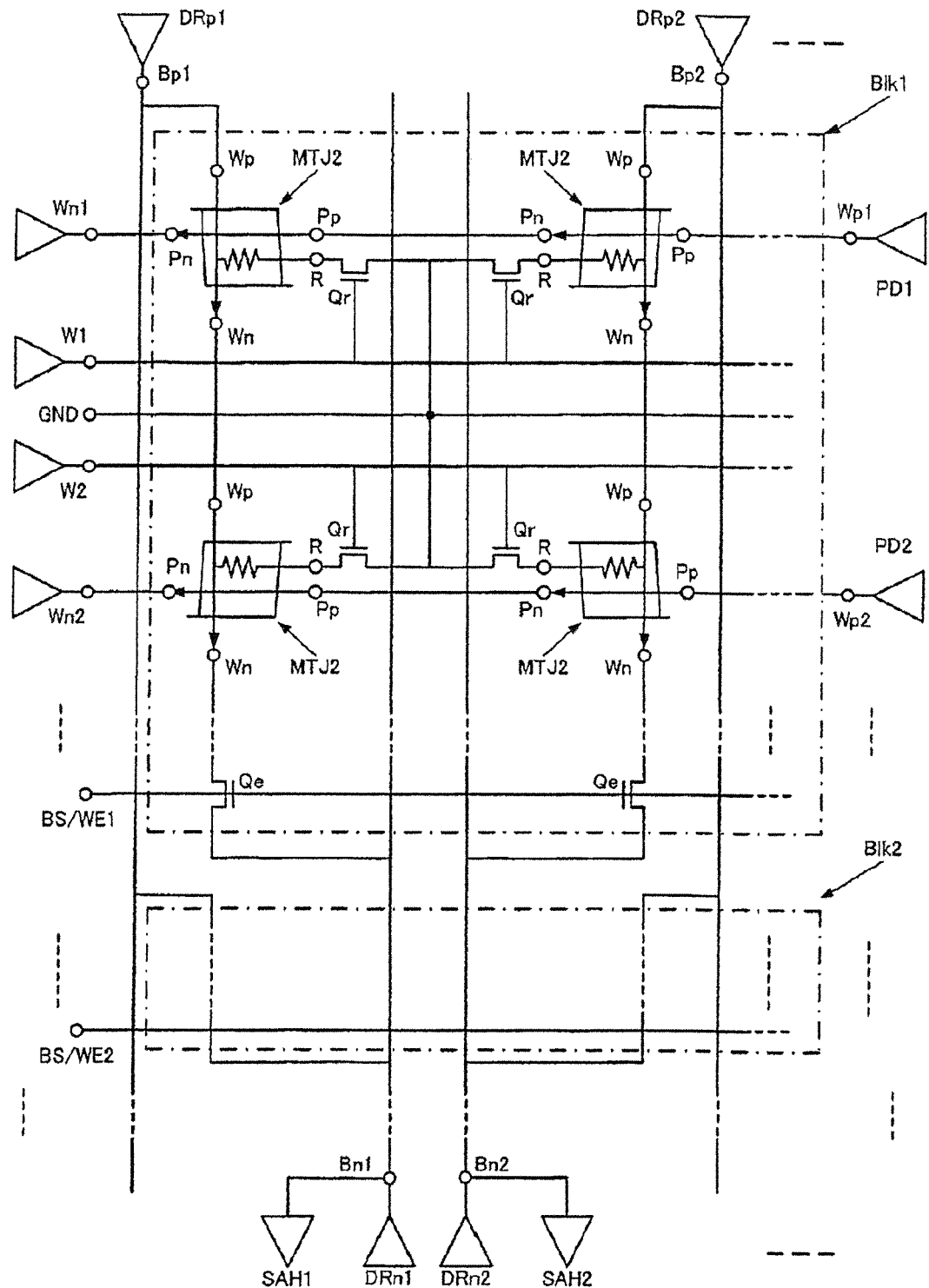
FIG. 14 is a block circuit diagram showing an equivalent circuit for a fifth MRAM device employing a plurality of the MTJ cells according to the second embodiment and suited to higher integration.

FIG. 14 is a block circuit diagram showing an equivalent circuit for a fifth MRAM device according to the second embodiment. The fifth MRAM device employs a plurality of the second MTJ cells according to the second embodiment and is suited to higher integration.

As shown in FIG. 14, each MRAM cell includes a second MTJ cell, and a transistor Qr whose drain is connected to the terminal R of the second MTJ cell, as in the fourth MRAM device in FIG. 13. The gate of the transistor Qr is connected to the word line Wi (i=1, 2, . . . ). The source of the transistor Qr is connected to a ground line GND. Terminals Wp and Wn of the second MTJ cell are sequentially connected in series, via inter-cell write bit lines, to terminals Wn and Wp on second MTJ cells of neighboring cells, thus forming a write bit line WpWn-WpWn.

Further, rather than physically forming the terminals Pp and Pn in the third metal layer 10 of each MRAM cell, write bias lines Wpi-Wni are formed parallel to the word lines Wi, penetrating the array of cells in the X-direction. The ground line GND is common for all MRAM cells and need not be selected for a row direction and/or column direction. However, for purposes of the wiring layout, one ground line GND is provided for every two rows in the preferred embodiment.

Further, when forming the MTJ 2 on the substrate 9, terminals R, Wp, and Wn are connected to the transistor Qr and the inter-cell write bit lines implanted in the substrate body through vias provided in the substrate. The ground line GND, write bias line Wpi-Wni, and all remaining circuits including peripheral circuits connected to the ground line GND and write bias line Wpi-Wni can be produced in the silicon substrate body through standard CMOS processes. Alternatively, rather than being implanted in the silicon substrate body, all or some of the inter-cell write bit lines, the ground line GND, and the write bias line Wpi-Wni can be formed above the second MTJ cell array with a suitable insulating layer formed therebetween.

Unlike the first through fourth MRAM devices, the fifth MRAM device is provided with a block selecting function. The write bit lines in the third and fourth MRAM devices according to the second embodiment are formed by connecting terminals Wp and Wn in the second metal layers 6 of neighboring second MTJ cells in series. Increasing the wiring length increases capacitance, which in turn increases resistance in the wiring, leading to a drop in operating speed and operating margin.

The block selecting function resolves this problem by dividing the cell array in the column (Y) direction into blocks Blk1, Blk2, . . . , as indicated by dashed lines in FIG. 14. Write bit lines WpWn-WpWn are separated by units of blocks and connected to separately provided first and second write bit lines Bpj and Bnj having low wiring resistance in units of blocks. For example, the Wp end of the write bit line WpWn-WpWn is connected to the first write bit line Bpj, and Wn end of the write bit line WpWn-WpWn is connected to the second write bit line Bnj via the source and drain of a transistor Qe. The gate of the transistor Qe is connected to a block select/write enable (BS/WE) provided for each block.

With the configuration shown in FIG. 14, a write operation is performed by applying a prescribed write bias current only to the selected ith write bias line Wpi-Wni, applying the high-level voltage VH to the block select/write enable (BS/WE) of the selected block, and applying the prescribed read voltage Vr to the write bit line WpWn-WpWn through the transistor Qe of the selected block to induce a magnetic field at the intersecting point (i, j). By applying the write current Iw from the Bpj end to the Bnj end in the selected column (jth column) at this time, a "0" is written to the MTJ in the cell at intersecting point (i, j). By applying the write current Iw in the reverse direction, a "1" is written to the MTJ of the cell.

As described above, the magnetic field induced by the write bias current in the selected $i^{th}$ write bias line aligns the easy axis of magnetization in the yoke of the MTJ cells positioned on the $i^{th}$ write bias line in the Y-direction. Hence, this configuration can reduce the write current Iw to about 100 µA, as in the third and fourth MRAM devices described above. However, since a write bias current is not applied to non-selected write bias lines, i.e., all write bias lines other than the $i^{th}$ write bias line, the quantum anisotropy in the yoke of the non-selected MTJ cells remains oriented in the X-direction. Therefore, the yoke does not produce an effect for reducing the write current Iw. In other words, forcibly writing to a non-selected MTJ cell requires a write current Iw of a few mA. Thus, selectively writing to an MTJ cell positioned at the intersecting point of the write bias current flowing in the X-direction and the write current Iw flowing in the Y-direction can be performed with extremely high selectivity (100 µagainst a few mA).

Note that the potential for all word lines Wi is set to a low level that turns off the transistors Qr, regardless of whether an $i^{th}$ row has been selected. This configuration can reduce power consumption since an electric current does not flow through the MTJs. Further, the read voltage Vr continues to be applied to all non-selected write bit lines Bpj-Bnj, minimizing the write recovery time (increasing the read access time for a read cycle immediately following a write cycle).

A read operation, on the other hand, is performed by driving only the selected $i^{th}$ word line Wi in the selected block at the high level to make the transistors Qr in all cells of the row conductive, and by applying the read voltage Vr to the write bit lines WpWn-WpWn via the first and second write bit lines Bpj and Bnj simultaneously for the selected column ($j^{th}$ column), conducting the tunnel current in the MTJ of the MRAM cell at the selected intersecting point (i, j) to the ground line GND via the transistor Qr and terminal R. A sense amplifier SAHj provided on the first write bit line Bpj or the second write bit line Bnj detects the magnitude of the tunnel current, i.e., "0" or "1". Although they are provided on the second write bit lines Bnj in the example of FIG. 14, the sense amplifiers SAHj may instead be provided on the first write bit lines Bpj or may alternate between first write bit lines Bpj and second write bit lines Bnj.

While in principle, any of the MTJ cells shown in FIG. 2 are applicable to the MRAM device of FIG. 14, only the MTJ according to the preferred embodiment shown in FIG. 2(*c*) has a practical application because the write current Iw can be suppressed to about 0.1 mA, as described above.

As with the fourth MRAM device described above, a constant-current writing method may be employed for writing operations on the fifth MRAM device. However, unlike the fourth MRAM device, the transistor Qe in the fifth MRAM device can be utilized to employ the constant-voltage writing methods described for the first and second MRAM devices. For example, both the driver DRpj provided on an end of the first write bit line Bpj and the driver DRnj provided on an end of the second write bit line Bnj serve as switching constant-voltage sources. The drivers DRpj and DRnj respectively supply a high-level voltage VH and low-level voltage VL to produce the write current +Iw, and respectively supply the low-level voltage VL and high-level voltage VH to produce the write current −Iw. At the completion of a write operation, outputs of both the drivers DRpj and DRnj return to the read voltage Vr. Here, the voltages VH, Vr, and VL satisfy the relationship VL≤Vr≤VH.

The transistor Qe is designed to have an appropriate size and gate voltage (high-level voltage of the block select/write enable (BS/WE)), and the saturation current of the transistor Qe is set to the write constant current Iw. In other words, since the transistor Qe is operated as a constant-current source, as with the constant-current writing methods described above, there is no need for a (switching) constant-current source circuit, which is generally more complex than a constant-voltage source circuit.

While each cell of the fourth MRAM device described above requires a total of 3.5 wires, including the write bit line, word line, ground line shared by neighboring cells, and write bias line, the fifth MRAM device additionally requires the first and second write bit lines Bpj and Bnj. However, these additional lines would also be necessary in the fourth MRAM device to reduce wire resistance in the write bit lines.

Note that to avoid saturation in the sense amplifiers and erroneous detection, after input of the sense amplifier SALj during a write operation to the third MRAM device, a ground potential or a low voltage equivalent to the input voltage of the sense amplifier SALj during a read operation is applied to the read bit line Bj. Further, during a read operation for the third MRAM device, the read voltage Vr is applied to one of the outputs of the drivers DRpj and DRnj respectively provided on both ends of the write bit line Bpj-Bnj, while the other output is cut off.

Similarly, during a write operation on the fourth MRAM device, the first and second write bit lines Bpj and Bnj are respectively driven as described above after cutting off the input of the sense amplifier SAHj from the write bit line Bpj-Bnj. Further, during a read operation on the fourth MRAM device, both outputs of the drivers DRpj and DRnj respectively provided on both ends of the write bit line Bpj-Bnj must be cut off while the sense amplifier SAHj supplies the read voltage Vr.

Similarly, during a write operation on the fifth MRAM device, the first and second write bit lines Bpj and Bnj are respectively driven as described above after cutting off the input of the sense amplifier SAHj from the first (or second) write bit line (Bpj (or Bnj). Further, during a read operation on the fifth MRAM device, both outputs of the drivers DRpj and DRnj respectively provided on the first and second write bit lines Bpj and Bnj must be cut off while the sense amplifier SAHj supplies the read voltage Vr.

Sense Amplifiers

The MRAM devices according to the first and second embodiments described above are provided with sense amplifiers SALj on the GND side in the first and third MRAM devices and sense amplifiers SAHj on the supply (VDD) side in the second, fourth, and fifth MRAM devices. The following description focuses on the structure of resistors used in the sense amplifiers according to the present invention. In the following description, "j" denotes the $j^{th}$ (j=1, 2, . . . ) column.

Figure 15:
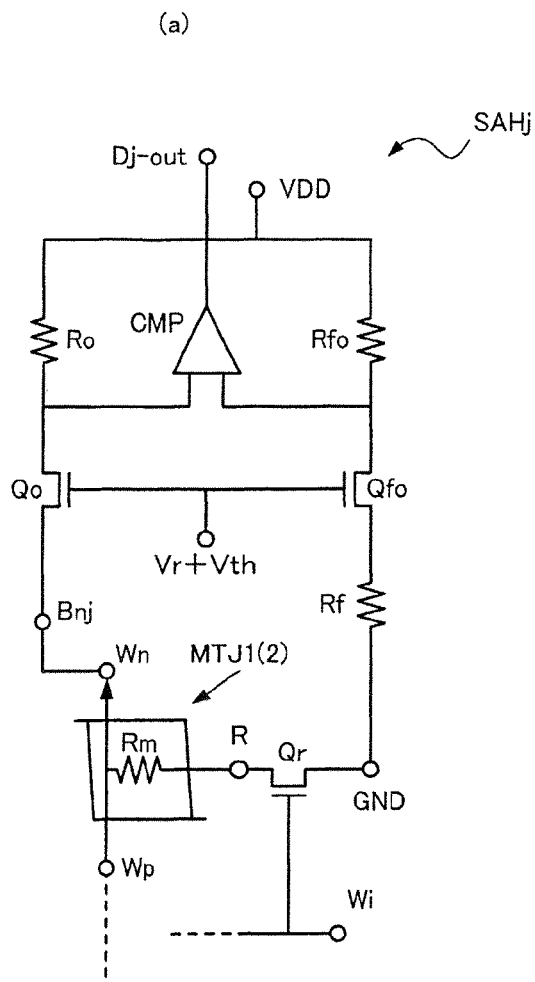
FIG. 15(a) is a schematic diagram of a supply-side sense amplifier.
FIG. 15(b) is a table indicating resistance values for reference resistors in the sense amplifier of FIG. 15(a)

FIG. 15(a) is a schematic diagram of a supply-side sense amplifier SAHj. FIG. 15(b) is a table indicating resistance values for reference resistors Rf and Rfo. A ground-side sense amplifier SALj could be similarly implemented by reversing the VDD and GND in the example of FIG. 15(a) to change the polarity of transistors Qo and Qfo from N-channel to P-channel.

Circuit elements related to write operations, such as the transistor Qw, the write drivers DRpj and DRnj, and the write bias line having terminals Pp and Pn have been omitted from FIG. 15(a), while the second write bit line Bnj represents the write bit line to which the sense amplifier SAHj is connected. During the read operation described above, the write drivers DRpj and DRnj are turned off after setting the first write bit line Bpj to the read voltage Vr so as not to interfere with operations of the sense amplifier.

In the sense amplifier SAHj, an MTJ tunnel current flowing through an MTJ tunnel resistor Rm in the selected MRAM cell, and a reference current flowing through the reference resistor Rf are respectively supplied to supply-side resistors Ro and Rfo through the transistors Qo and Qfo, to whose gates a constant voltage is applied. The resulting differential voltages are compared in a comparator CMP and outputted as Dj-out. Since a constant voltage Vr+Vth (where Vth is a common threshold voltage for Qo and Qfo) is being applied to the gates of the transistors Qo and Qfo, the potential of the write bit line Bnj is maintained at the read voltage Vr, enabling high-speed read operations.

Since the MTJ tunnel resistor Rm takes on a small resistance Rs or a large resistance Rb depending on whether the storage content of the MTJ is "0" or "1", so that the MTJ tunnel resistor Rm passes a corresponding "large" or "small" tunnel current. The reference resistor Rfo should be configured to produce a voltage between the "0" voltage and "1" voltage produced from the resistor Ro. This can be achieved by setting the resistance values of the reference-side resistors Rf and Rfo to one of the three examples shown in FIG. 15(b). The small resistance Rs and large resistance Rb of the MTJ tunnel resistor Rm are typically 10 kΩ and 20 kΩ, respectively, and the wire resistance and resistance to conduction in the transistor Qr are negligible in comparison.

The resistors Ro, Rf, and Rfo can be implemented using one or both of a semiconductor resistor or MTJ tunnel resistor. When implementing all resistors with semiconductors, for example, the Rfo is configured of the same semiconductor resistor as the Ro, and the design center value of the Rf is determined using the design center values of the small resistance Rs and large resistance Rb for the MTJ tunnel resistor Rm, as in Example 1. While this is a simple method, the differential margin of operations can be small because the characteristics of the semiconductor and MTJ vary independently of each other.

Alternatively, the resistors Ro, Rf, and Rfo may be implemented with both a semiconductor resistor and an MTJ tunnel resistor. In Example 1 described above, the Rf may be implemented with the same semiconductor resistor as the Ro, while the Rf can be configured of two MTJ tunnel resistors Rm respectively having the small resistance Rs and large resistance Rb that are connected in series or parallel. This configuration completely cancels all variations in the characteristics of the semiconductor and MTJ.

Examples 2 and 3 show configurations that fall between the two configurations described above for Example 1. Here, the MTJ tunnel resistor Rm having either the small resistance Rs or large resistance Rb is used as the Rf, and a semiconductor resistor is used as the Rfo. These configurations can cancel most variation in characteristics of the semiconductor and MTJ, though not completely.

The MTJ tunnel resistor Rm having the small resistance Rs or the large resistance Rb may also be implemented according to various methods. For example, an MTJ whose pinned layer and storage layer have magnetization in the Y-direction and X-direction, respectively, through fabrication processes and an MTJ whose pinned layer and storage layer have magnetization in the Y-direction and X-direction, respectively, through their planar shapes together provide an MTJ tunnel resistor Rm having an intermediate value Rmid between the small resistance Rs and large resistance Rb, generally regardless of the magnetization state of the storage layer. Naturally, an MTJ cell storing a "0" or an MTJ cell storing a "1" produces an MTJ tunnel resistor Rm having the small resistance Rs or the large resistance Rb immediately after the MRAM device is powered on. Further, when the MRAM device is provided with write bias lines, as in the third, fourth, and fifth MRAM devices in the second embodiment, an MTJ cell storing a "0" and/or an MTJ cell storing a "1" can be formed during the fabrication process of the MRAM device by magnetizing or applying a magnetic field to a yoke whose quantum easy axis is aligned in the X-direction.

Figure 16:
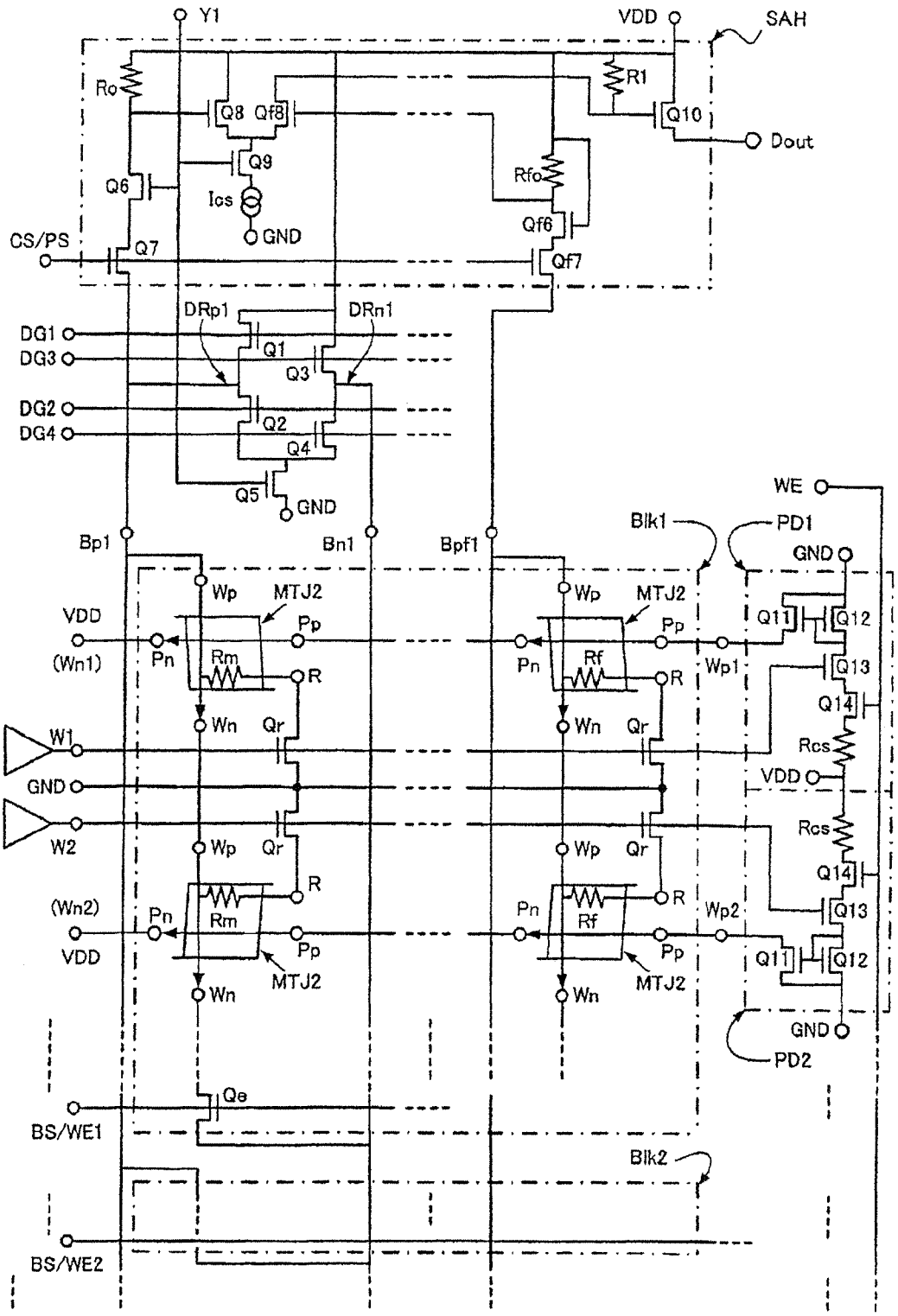
FIG. 16 is a block circuit diagram showing a more detailed equivalent circuit for the fifth MRAM device in FIG. 14.

FIG. 16 is a block circuit diagram showing a more detailed equivalent circuit for the fifth MRAM device (FIG. 14). The circuit approach used in FIG. 16 can easily be applied to the first through fourth MRAM devices. For simplification, only two memory cells are shown in the diagram in two rows (i=1, 2) and one column (j=1). In FIG. 16 the driver DRpj provided on one end of the first write bit line Bpj and the driver DRnj provided on one end of the second write bit line Bnj are "totem pole" type switching constant-voltage sources respectively configured of transistors Q1 and Q2 and transistors Q3 and Q4 and are switched in a complementary manner by input signals DG1-DG4 controlled based on write data Dj-in (not shown). The drivers DRpj and DRnj are both selectively activated through a transistor Q5 controlled by a column selection signal Yj.

The sense amplifier SAH in FIG. 16 has a single reference circuit for the plurality of cell-array columns. The reference circuit includes a reference cell array in one column (all cells storing a "0" or a "1" according to one of the methods described above). The MTJ tunnel current flowing through the MTJ tunnel resistor Rm of the selected cell (cell in the $i^{th}$ row and $j^{th}$ column) serves as the read current that flows through the first write bit line Bpj, a transistor Q7 whose gate input is a chip select input CS/PS, and a column selection transistor Q7 whose gate input is the column selection signal Yj, producing a different voltage drop in the supply-side resistor Ro depending on whether the stored content in the cell is a "0" or "1".

The reference circuit similarly has an MTJ tunnel current flowing through the MTJ resistor Rf of the selected reference cell in the reference cell-array column. As shown in the drawing, the MTJ tunnel current flows through a first reference write bit line Bpfl, a transistor Qf7 whose gate input is the chip select input CS/PS, and a dummy transistor Qf6 whose gate input is the supply voltage VDD, producing an intermediate voltage in the supply-side resistor Rfo. The resulting voltages are inputted into a differential amp (comparator) having transistors Q8 and Qf8, which outputs read data to Dout.

The level of the chip select input CS/PS during a selection is set to the read level Vr+the transistor threshold Vth to maintain the first write bit line Bpj at a fixed potential, regardless the magnitude of the read current. The resistance value of the supply-side resistor Rfo changes as described above depending on whether a "0" or "1" is stored in the reference cell and always produces a fixed voltage drop in between a "0" and "1". A wired-OR is employed in FIG. 16 to produce voltage drop in a resistor R1 used commonly for the outputs of differential amps in all columns. However, for improved speed it is better to provide an output buffer circuit for each column and to employ a logic OR gate (or NOR gate) for all output.

As shown in FIG. 16, a driver PDi for the write bias current is connected to the Wpi end of the write bias line Wpi-Wni, while the Wni end is simply connected to the power supply VDD. The driver PDi is configured of a reference circuit including a diode-connected transistor Q12, a row selection transistor Q13, a transistor Q14 activated only during a write operation by a write enable WE signal, and a resistor Rcs, as well as a constant-current output transistor Q11 sharing a gate potential with the transistor Q12. By operating in the saturation region, the transistor Q11 serves as a constant-current sink. The magnitude of the constant current can easily be configured based on the size ratio of the transistors Q11 and Q12. For example, a size ratio of 20 can produce a write bias current of 2 mA, even when the reference current regulated by the resistor Rcs is 100 µA. Moreover, these currents can be implemented with little power since they flow only in the selected $i^{th}$ row.

Second Embodiment

First Implementation of the Fourth MRAM Device

Figure 17:
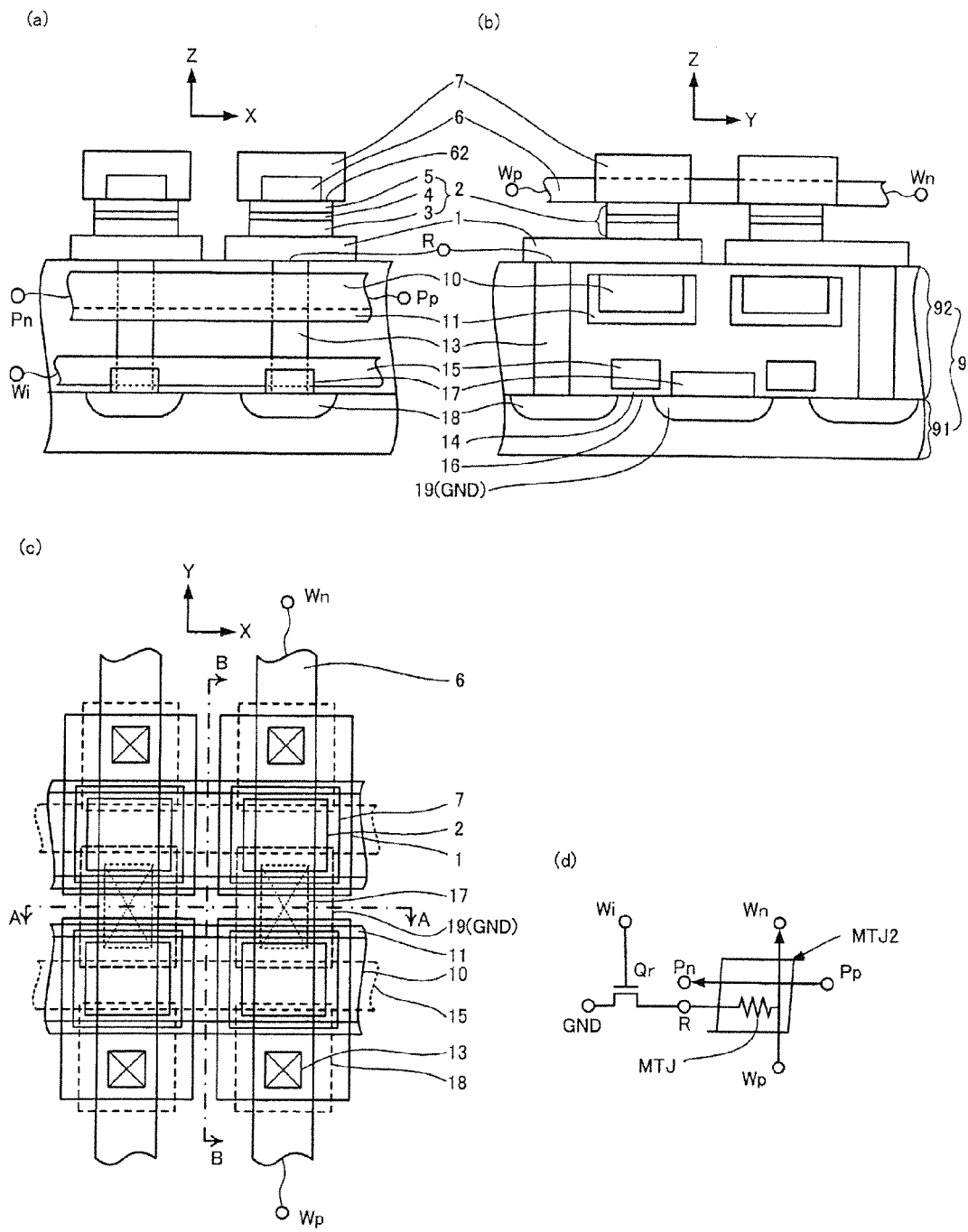
FIGS. 17(a), 17(b), and 17(c) are schematic diagrams of first MRAM cells for implementing the fourth MRAM device according to the second embodiment on a silicon substrate.
FIG. 17(d) is a circuit diagram for one MRAM cell in the fourth MRAM device of FIG. 13.

FIG. 17 includes schematic diagrams of a second MRAM cell for implementing the fourth MRAM device described above on a silicon substrate. FIG. 17(d) is a circuit diagram for one MRAM cell in the fourth MRAM device of FIG. 13, and FIGS. 17(a), 17(b), and 17(c) show the structure of the MRAM cell, with FIG. 17(c) being a transparent XY plan view of the MRAM cell and FIGS. 17(a) and 17(b) being cross-sectional views indicated respectively by lines A-A and B-B in FIG. 17(c). While FIG. 17(c) is a transparent view, some members in the silicon substrate are depicted with dashed lines to facilitate understanding. Further, the contours of various members depicted in the transparent XY plan view of FIG. 17(c) are intentionally offset in the transparent XY plan view of FIG. 17(c) to eliminate overlap and do not necessarily represent the actual sizes of these members.

As shown in FIG. 17, the MRAM cell includes a transistor Qr and a via 13 embedded in the substrate 9, and a second yoke-type MTJ cell (hereinafter simply called a "second MTJ cell" and denoted by "MTJ2" in the drawings, just as is defined in relation to FIG. 1 in the above) formed on top of the substrate 9. The third metal layer 10 (write bias line) of the MTJ cell is embedded in the substrate 9. Here, a more detailed description will be given for parts of the second MTJ cell not described with reference to FIG. 10 in the second embodiment.

The transistor Qr includes a gate insulating layer 14 and a channel region 16 as well as a gate 15, drain 18, and a source 19.

The third metal layer 10 includes a cladding layer 11. The cladding layer 11 is formed of a ferromagnetic material, such as Permalloy, and covers the bottom surface and both side surfaces of the third metal layer 10, but not the top surface of the third metal layer 10 that opposes the yoke 7. As described above, the cladding layer 11 functions to induce a strong magnetic field in the ferromagnetic material that passes through the yoke 7 in the Y-direction when a write bias current flows through the third metal layer 10, thereby reducing the write bias current required to apply a prescribed magnetic field to the yoke 7.

Next, a relaxed coupling 62 produced between the yoke 7 and the portion of the storage layer 5 not covered by the second metal layer 6 (write bit line) will be described. The relaxed coupling 62 is defined as a coupling that is sufficient both for essentially satisfying the continuity of flux return and for maintaining the magnetization direction of the yoke 7 either parallel or orthogonal to the magnetization direction of the storage layer 5. This specification describes two possible structures of the relaxed coupling 62. The second structure described below is represented in the drawings, but the present invention is not limited to this structure.

The first structure is achieved as described with reference to FIGS. 4 through 6 and the like for the first MTJ cell according to the first embodiment by etching portions of the MTJ 2 not covered by the second metal layer 6 to form surfaces that slope at least in the X-direction, by covering the sloped portions with the bird's-beak insulating layer and/or the third insulating layer, and by positioning the yoke 7 to contact the storage layer 5 through these insulating layers. While it is necessary to control the angle of inclined etching and the shape and thickness of the bird's beak insulating layer in order to produce a relaxed coupling between the yoke 7 and storage layer 5 with no coupling between the yoke 7 and pinned layer 3, this structure is advantageous in that inclined etching (ion milling) can be performed using the second metal layer 6 as a mask to form the sloped surfaces through self-alignment.

The second structure is achieved by vertically and extensively etching only the parts of the MTJ 2 that extend out from the second metal layer 6, and by arranging the yoke 7 on top of the storage layer 5 so as to contact the storage layer 5 either directly or through a suitable insulating layer. This structure has become possible through recent advances in precision anisotropic etching.

Next, the remaining members accommodated in the substrate 9 will be described. The substrate 9 includes a substrate body 91, and a wiring body 92 formed on top of the substrate body 91. The via 13 penetrates the wiring body 92, connecting the terminal Ron the first metal layer 1 to a drain 18 of the transistor Qr. A gate 15 of the transistor Qr extends in the X-direction to serve as the gate in the adjacent MRAM cell, forming a word line Wi (i=1, 2, . . . ). A source 19 of the transistor Qr is a shared source with the transistor Qr of the MRAM cell adjacent in the Y-direction and is provided with a suitable GND contact 17.

By providing the third metal layer 10, including the cladding layer 11, in a space above the gate 15 of the transistor Qr, the MRAM cell can be implemented with a compact structure having a size of 2F×3F=6F², where F is the minimal feature size.

Second Embodiment

Second Implementation of the Fourth MRAM Device

Figure 18:
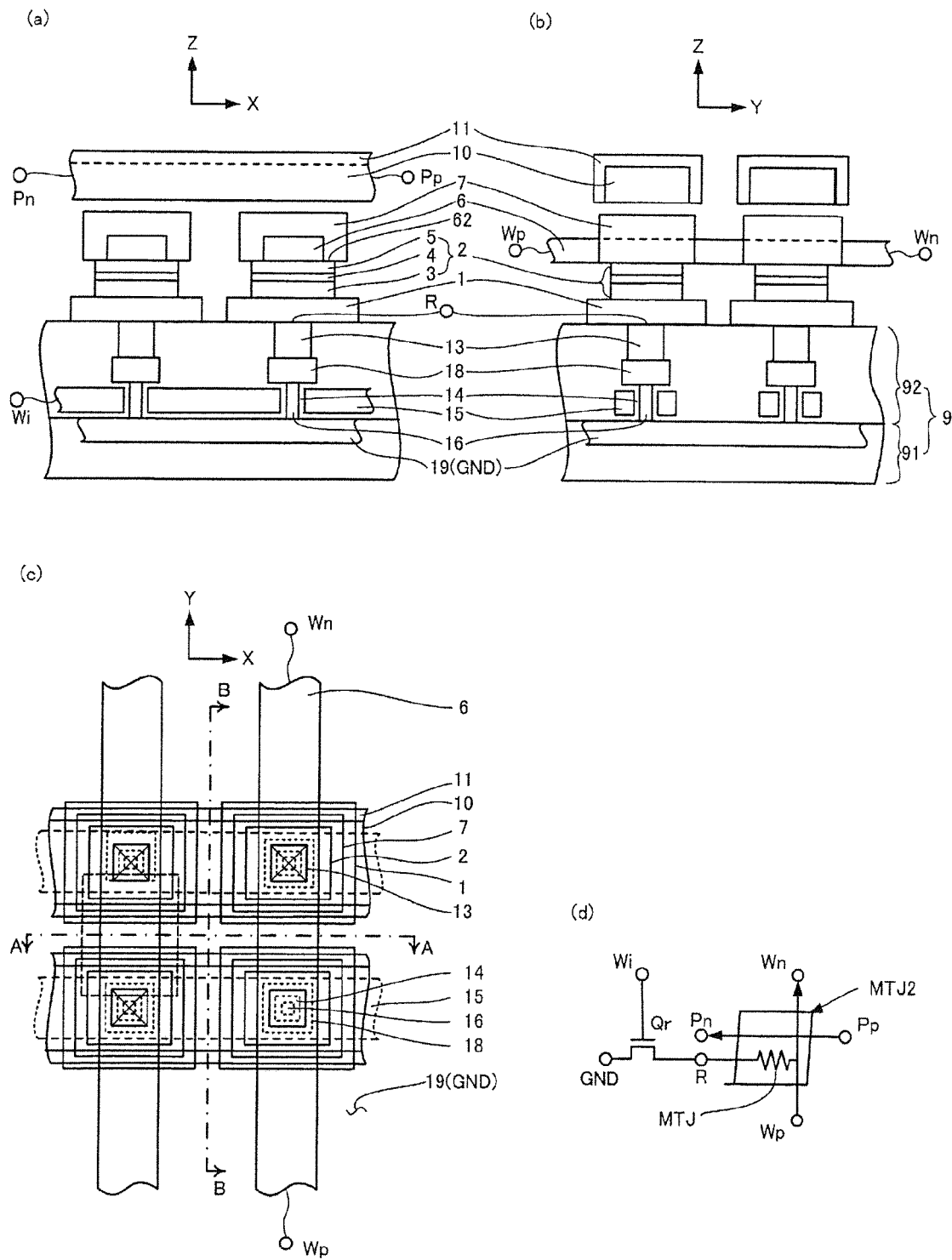
FIGS. 18(a), 18(b), and 18(c) are schematic diagrams of second MRAM cells for implementing the fourth MRAM device according to the second embodiment on a silicon substrate.
FIG. 18(d) is a circuit diagram for one MRAM cell in the fourth MRAM device of FIG. 13.

FIG. 18 includes schematic diagrams of a second MRAM cell for implementing the fourth MRAM device on a silicon substrate. This implementation shares most points with the first implementation described with reference to FIG. 17, and a detailed description of those points will not be repeated here. The variation in FIG. 18 differs in that the transistor Qr is arranged vertically, and the third metal layer 10, including the cladding layer 11, is disposed above the yoke 7.

The transistor Qr in this example is formed using an n⁺-type diffusion layer region (also serving as a common ground layer (GND)), for example, as the source 19; using an n⁺-type polysilicon wiring layer (also serving as a word line Wi), for example, provided in the bottommost layer of the wiring body 92 through a suitable insulating layer as the gate 15; using a cylindrical insulating thin film deposited on the inner wall of a through-hole provided in the gate 15 as a gate insulating layer 14; using a p⁻-silicon region, for example, filling the space surrounded by the gate insulating layer 14 as a channel region 16; and using an n⁺-type silicon region, for example, provided above the through-hole so as to contact the channel region 16 as the drain 18.

The third metal layer 10 is disposed above the yoke 7, which is positioned above the storage layer 5 of the MTJ cell. The cladding layer 11 covers three surfaces of the third metal layer 10, while leaving the bottom surface of the third metal layer 10 opposing the yoke 7 exposed. Since the members constituting the MRAM cell in this example are all integrated vertically (in the Z-direction), the MRAM cell can be implemented with a more compact structure, having a size of 2F×2F=4F².

As another implementation that falls between the first and second implementations described above, the write bias line disposed above the yoke 7 may be combined with a common (horizontal-type) transistor Qr. In this case, the MRAM cell can be fabricated at a size of approximately 2F×2.5F=5F².

Current Consumption of MRAM Cells in a Selected Row (Word)

According to the first and second MRAM devices of the first embodiment and the third, fourth, and fifth MRAM devices of the second embodiment described above, the prescribed read voltage Vr is continuously applied to non-selected first and second write bit lines Bpj and Bnj or write bit lines Bpj-Bnj. Consequently, a read current Ir flows through all MRAM cells belonging to the selected row (word line Wi, where I=1, 2, . . . ). If Ir=5 μA and one word includes 1 Kbits of data, for example, the total current would rise to 5 mA, resulting in a significant increase in standby power.

One measure for resolving this problem is to select a block along the direction of columns (read bit lines Bj, where j=1, 2, . . . ). That is, the cell array is divided into blocks having sixteen columns each, for example, and all word lines including the selected word line are set to a low level in blocks that do not include the selected column address. This configuration can limit the increase in standby current consumption to about 80 μA. The configuration requires about two word lines per row (a word line for the entire row and a word line specific to the block). However, since there is room for wiring in the upper metal layer (wiring body 92) along the word direction, it is possible to implement wiring that preserves an MRAM cell pitch of 2F.

A second measure for resolving this problem is to cut off or apply a low level (GND) voltage to the first and second write bit lines Bpj and Bnj or the write bit lines Bpj-Bnj that are not selected (including during standby). This measure eliminates an increase in standby power. However, during a read operation, it is necessary to restore the potential of the selected write bit line to the read voltage Vr (a potential different from GND) even by activating the constant voltage (Vr) driver, resulting in slower read access times.

ALPHANUMERIC CHARACTERS USED IN THE DRAWINGS AND TEXT 1 first metal layer
2 MTJ
3 pinned layer
4 barrier layer
5 storage layer
6 second metal layer (write bit line)
7 yoke
8 insulating layer
9 substrate, silicon substrate
10 third metal layer (write bias line)
11 cladding layer
13 via
14 gate insulating layer
15 gate (word line)
16 channel region
17 GND contact
18 drain
19 source
32 antiferromagnetic layer
34 ferromagnetic layer
37c sloped surface of the pinned layer
39 residual pinned layer
52 storage layer cap
57a contact surface of the storage layer
57b portion of the first insulating layer above the sloped surface of the storage layer
57c sloped surface of the storage layer
62 relaxed coupling
64 bottom cap
66 primary metal layer
68 top cap
82 first insulating layers
84 second insulating layer
85 third insulating layer
91 substrate body
92 wiring body
822 first bird's beak
842 second bird's beak

The invention claimed is:
1. An MTJ cell comprising:
a first metal layer disposed on the surface of a substrate aligned with an XY plane and elongated in the X-direction (one end in the elongated direction having a terminal R);
a second metal layer separated from the first metal layer in a Z-direction (hereinafter "above") and elongated in the Y-direction orthogonal to the X-direction (ends in the elongated direction having terminals Wp and Wn, respectively);

a magnetic tunnel junction (hereinafter "MTJ") interposed between overlapping parts of the first and second metal layers, the MTJ comprising a ferromagnetic pinned layer, a nonmagnetic barrier layer, and a ferromagnetic storage layer (hereinafter simply called the "pinned layer," "barrier layer," and "storage layer," respectively) stacked in the order given and including extended parts not covered by the second metal layer, and producing a small resistance or a large resistance in the Z-direction, respectively assigned a "0" state and "1" state, depending on whether the magnetization states of the pinned layer and the storage layer are parallel or antiparallel; and a yoke comprising a ferromagnetic material or a high-permeability magnetic material and having a YZ cross-sectional area greater than the YZ cross-sectional area of the storage layer, the yoke spanning across and covering a portion of the second metal layer, with both ends of the yoke in the X-direction contacting extended parts of the storage layer not covered by the second metal layer, either directly or through a nonmagnetic insulating layer;

wherein the storage layer of the MTJ has a shape in an XY plane possessing a quantum easy axis in the X-direction, while the yoke has a shape in an XY plane possessing a quantum easy axis in the Y-direction; and the storage layer exhibits a relaxed coupling with the yoke at the extended parts not covered by the second metal layer that essentially satisfies the continuity of flux return directly or indirectly through a nonmagnetic insulating layer, while maintaining a quantum easy axis orthogonal to that of the yoke.

2. The MTJ cell according to claim 1, wherein, in order to provide the storage layer and the yoke with a quantum easy axis through shape anisotropy, the shape of the MTJ in the XY plane is rectangular with its long sides aligned in the X-direction, and the shape of the yoke in the XY plane is rectangular with its long sides aligned in the Y-direction.

3. The MTJ cell according to claim 1, wherein the quantum easy axes of the storage layer and the yoke is formed to be independent of each other through deposition of an antiferromagnetic film.

4. The MTJ cell according to claim 2, wherein the nonmagnetic insulating layer comprises:

a first insulating layer shaped with a bird's beak, the tip of the bird's beak reaching the sloped surface of the storage layer; and a second insulating layer formed on top of the first insulating layer and shaped with a bird's beak, the tip of the bird's beak not reaching above the sloped surface of the storage layer.

5. The MTJ cell according to claim 4, further comprising a third insulating layer comprising nonmagnetic material that is interposed between (1) the second metal layer and the nonmagnetic insulating layer and (2) the yoke.

6. An MTJ cell comprising:

a first metal layer disposed on the surface of a substrate aligned with an XY plane and elongated in the X-direction (one end in the elongated direction having a terminal R);

a second metal layer separated from the first metal layer in a Z-direction (hereinafter "above") and elongated in the Y-direction orthogonal to the X-direction (ends in the elongated direction having terminals Wp and Wn, respectively);

a magnetic tunnel junction (hereinafter "MTJ") interposed between overlapping parts of the first and second metal layers, the MTJ comprising a ferromagnetic pinned layer, a nonmagnetic barrier layer, and a ferromagnetic storage layer (hereinafter simply called the "pinned layer," "barrier layer," and "storage layer," respectively) stacked in the order given and including extended parts not covered by the second metal layer, and producing a small resistance or a large resistance in the Z-direction, respectively assigned a "0" state and "1" state, depending on whether the magnetization states of the pinned layer and the storage layer are parallel or antiparallel;

a yoke comprising a ferromagnetic material or a high-permeability magnetic material and having a YZ cross-sectional area greater than the YZ cross-sectional area of the storage layer, the yoke spanning across and covering a portion of the second metal layer, with both ends of the yoke in the X-direction contacting extended parts of the storage layer not covered by the second metal layer, either directly or through a nonmagnetic insulating layer; and a third metal layer elongated in the X-direction;

wherein the storage layer of the MTJ has a shape in an XY plane possessing a quantum easy axis in the X-direction, and the yoke has a shape in an XY plane possessing a quantum easy axis in the X-direction;

the storage layer exhibits a relaxed coupling with the yoke at the extended parts not covered by the second metal layer that essentially satisfies the continuity of flux return directly or indirectly through a nonmagnetic insulating layer and maintains a quantum easy axis orthogonal to that of the yoke; and Y-direction quantum anisotropy is produced in the yoke by a magnetic field induced by a write bias current applied to the third metal layer.

7. The MTJ cell according to claim 6, wherein the third metal layer is cladded with a magnetic layer, except on the surface on the MTJ cell that opposes the yoke.

8. The MTJ cell according to claim 6, wherein the nonmagnetic insulating layer comprises:

a first insulating layer shaped with a bird's beak, the tip of the bird's beak reaching the sloped surface of the storage layer; and a second insulating layer formed on top of the first insulating layer and shaped with a bird's beak, the tip of the bird's beak not reaching above the sloped surface of the storage layer.

9. The MTJ cell according to claim 8, further comprising a third insulating layer comprising nonmagnetic material that is interposed between (1) the second metal layer and the nonmagnetic insulating layer and (2) the yoke.

10. A method of fabricating an MTJ cell, including steps of:

forming, elongated in an X-direction, a first metal layer on the surface of a substrate;

forming a magnetic tunnel junction ("MTJ") on the first metal layer, the MTJ comprising a ferromagnetic pinned layer, a nonmagnetic barrier layer, and a ferromagnetic storage layer stacked in the order given;

forming, elongated in the Y-direction (orthogonal to the X-direction), a second metal layer on the MTJ such that the MTJ includes extended parts not covered by the second metal layer;

forming a nonmagnetic insulating layer comprising a first insulating layer and a second insulating layer;

wherein:

the first insulating layer is formed, shaped with a bird's beak, the tip of the bird's beak reaching the sloped surface of the storage layer, through deposition at a first angle of incidence, while the second insulating layer is formed on top of the first insulating layer and shaped with a bird's beak, the tip of the bird's beak not reaching above the sloped surface of the storage layer, through deposition at a second angle of incidence different from the first angle of incidence, and forming a yoke comprising a ferromagnetic material or a high-permeability magnetic material, spanning across and covering a portion of the second metal layer, with both ends of the yoke in the X-direction contacting the extended parts of the storage layer not covered by the second metal layer, indirectly through the nonmagnetic insulating layer;

wherein the storage layer of the MTJ has a shape in an XY plane possessing a quantum easy axis in the X-direction, while the yoke has a shape in an XY plane possessing a quantum easy axis in the Y-direction.

11. An MRAM device comprising a plurality of MRAM cells arranged in the XY plane, a plurality of word lines Wi, a plurality of first write bit lines Bpj, a plurality of read bit lines Bj, a plurality of second write bit lines Bnj, and a sense amplifier provided on an end of each of the read bit lines Bj, each MRAM cell comprising:

the MTJ cell according to claim 1;

a transistor Qw whose source is connected to the terminal Wp in the MTJ cell; and a transistor Qr whose drain is connected to the terminal R in the MTJ cell;

wherein the gates of the transistors Qw and Qr are connected to an $i^{th}$ word line Wi (i=1, 2, ...);

the drain of the Qw is connected to a $j^{th}$ first write bit line Bpj (j=1, 2, ...);

the source of the Qr is connected to a $j^{th}$ read bit line Bj;

the terminal Wn of the MTJ cell is connected to a $j^{th}$ second write bit line Bnj;

MRAM cells connected to the $i^{th}$ word line Wi are selected by driving the single $i^{th}$ word line Wi at high level to make the transistors Qw and Qr in the MRAM cells connected to the $i^{th}$ word line Wi conductive;

a write operation to write a "0" is performed by applying a write current Iw to the selected column ($j^{th}$ column) flowing from the first write bit line Bpj to the second write bit line Bnj via the transistor Qw, the induced magnetic field changing the direction of the easy axis of magnetization in the storage layer of the MTJ belonging to the MRAM cell at an intersecting point (i, j) to match the direction of easy axis of magnetization in the pinned layer, and a write operation to write a "1" is performed by applying a write current Iw in the reverse direction, the induced magnetic field changing the direction of the easy axis of magnetization in the storage layer of the MTJ at the intersecting point (i, j) to the direction opposite the easy axis of magnetization in the pinned layer; and a read operation, on the other hand, is performed by applying a read voltage Vr to at least the second write bit line Bnj of the selected column ($j^{th}$ column) to conduct a tunnel current flowing through the MTJ via the transistor Qw and terminal Wp in the MRAM cell at the selected intersecting point (i, j) to the read bit line Bj via the terminal R, and by detecting a large or small tunnel current as a "0" or "1", respectively, with the sense amplifier provided on the read bit line Bj.

12. The MRAM device according to claim 11, wherein the sense amplifier comprises a circuit for generating a reference voltage corresponding to an intermediate value of the tunnel current at "0" (large) and the tunnel current at "1" (small); and the resistive element providing resistors that determine the value of the reference voltage is one of (1) a semiconductor resistor, (2) an MTJ whose pinned layer and storage layer have magnetization in the Y-direction and X-direction, respectively, through a fabrication process, (3) an MTJ whose pinned layer and storage layer have magnetization in the Y-direction and X-direction, respectively, through their planar shape, (4) a composite element including an MTJ cell storing a "0" and an MTJ cell storing a "1" immediately after the MRAM device is powered on, and (5) an MTJ cell storing either a "0" or a "1" immediately after the MRAM device is powered on.

13. The MRAM device according to claim 12, comprising a plurality of the resistive elements arranged in at least one column in the Y-direction.

14. The MRAM device according to claim 11, further comprising a first driver DRpj and a second driver DRnj respectively connected to the first and second write bit lines Bpj and Bnj;

wherein in a write operation the first driver DRpj and the second driver DRnj respectively supply a high voltage VH and a low voltage VL to produce a write current Iw determined by the transistor Qw, or the first driver DRpj and the second driver DRnj respectively supply the low voltage VL and the high voltage VH to produce a write current Iw in the reverse direction determined by the transistor Qw; and the read voltage Vr is larger than the low voltage VL but smaller than the high voltage VH.

15. The MRAM device according to claim 11, further comprising a first driver DRpj and a second driver DRnj respectively connected to the first and second write bit lines Bpj and Bnj;

wherein in a write operation the second driver DRnj constantly supplies the read voltage Vr, and the first driver DRpj supplies a high voltage VH to produce a write current Iw determined by the transistor Qw, or the first driver DRpj supplies the low voltage VL to produce a write current Iw in the reverse direction determined by the transistor Qw; and the read voltage Vr is larger than the low voltage VL but smaller than the high voltage VH.

16. The MRAM device according to claim 11, wherein the MRAM cells connected to the word lines Wi are divided into a plurality of blocks;

during a read or write operation, a block is selected based on the results of decoding a plurality of higher-order bits in column address data, and the block word line corresponding to the selected block is driven at high level while the block word lines corresponding to non-selected blocks are driven at low level so that a read current does not flow in any of MRAM cells of non-selected blocks; and during standby, all block word lines are driven at low level so that a read current does not flow in any of MRAM cells of all blocks.

17. An MRAM device comprising a plurality of MRAM cells arranged in the XY plane, a plurality of word lines Wi, a plurality of first write bit lines Bpj, a plurality of ground lines GND, a plurality of second write bit lines Bnj, and a sense amplifier provided on an end of each of the first write bit lines Bpj or second write bit lines Bnj, each MRAM cell comprising:

the MTJ cell according to claim 1;

a transistor Qw whose source is connected to the terminal Wp in the MTJ cell; and a transistor Qr whose drain is connected to the terminal R in the MTJ cell;

wherein the gates of the transistors Qw and Qr are connected to an $i^{th}$ word line Wi (i=1, 2, ...);

the drain of the Qw is connected to a $j^{th}$ first write bit line Bpj (j=1, 2, ...);

the source of the Qr is connected to one of the ground lines GND;

the terminal Wn of the MTJ cell is connected to a $j^{th}$ second write bit line Bnj;

MRAM cells connected to the $i^{th}$ word line Wi are selected by driving the single $i^{th}$ word line Wi at high level to make the transistors Qw and Qr in the MRAM cells connected to the $i^{th}$ word line Wi conductive;

a write operation to write a "0" is performed by applying a write current Iw to the selected column ($j^{th}$ column) flowing from the first write bit line Bpj to the second write bit line Bnj via the transistor Qw, the induced magnetic field changing the direction of the easy axis of magnetization in the storage layer of the MTJ belonging to the MRAM cell at an intersecting point (i, j) to match the direction of easy axis of magnetization in the pinned layer, and a write operation to write a "1" is performed by applying a write current Iw in the reverse direction, the induced magnetic field changing the direction of the easy axis of magnetization in the storage layer of the MTJ at the intersecting point (i, j) to the direction opposite the easy axis of magnetization in the pinned layer; and a read operation is performed by applying a read voltage Vr to at least the second write bit line Bnj of the selected column ($j^{th}$ column) to conduct a tunnel current flowing through the MTJ either directly or via the transistor Qw and terminal Wp in the MRAM cell at the selected intersecting point (i, j) to the ground line GND through the transistor Qr, and by detecting a large or small tunnel current as a "0" or "1", respectively, with the sense amplifier.

18. The MRAM device according to claim 17, wherein the sense amplifier comprises a circuit for generating a reference voltage corresponding to an intermediate value of the tunnel current at "0" (large) and the tunnel current at "1" (small); and the resistive element providing resistors that determine the value of the reference voltage is one of (1) a semiconductor resistor, (2) an MTJ whose pinned layer and storage layer have magnetization in the Y-direction and X-direction, respectively, through a fabrication process, (3) an MTJ whose pinned layer and storage layer have magnetization in the Y-direction and X-direction, respectively, through their planar shape, (4) a composite element including an MTJ cell storing a "0" and an MTJ cell storing a "1" immediately after the MRAM device is powered on, and (5) an MTJ cell storing either a "0" or a "1" immediately after the MRAM device is powered on.

19. The MRAM device according to claim 17, further comprising a first driver DRpj and a second driver DRnj respectively connected to the first and second write bit lines Bpj and Bnj;

wherein in a write operation the first driver DRpj and the second driver DRnj respectively supply a high voltage VH and a low voltage VL to produce a write current Iw determined by the transistor Qw, or the first driver DRpj and the second driver DRnj respectively supply the low voltage VL and the high voltage VH to produce a write current Iw in the reverse direction determined by the transistor Qw; and the read voltage Vr is larger than the low voltage VL but smaller than the high voltage VH.

20. The MRAM device according to claim 17, further comprising a first driver DRpj and a second driver DRnj respectively connected to the first and second write bit lines Bpj and Bnj;

wherein in a write operation the second driver DRnj constantly supplies the read voltage Vr, and the first driver DRpj supplies a high voltage VH to produce a write current Iw determined by the transistor Qw, or the first driver DRpj supplies the low voltage VL to produce a write current Iw in the reverse direction determined by the transistor Qw; and the read voltage Vr is larger than the low voltage VL but smaller than the high voltage VH.

21. The MRAM device according to claim 17, wherein the MRAM cells connected to the word lines Wi are divided into a plurality of blocks;

during a read or write operation, a block is selected based on the results of decoding a plurality of higher-order bits in column address data, and the block word line corresponding to the selected block is driven at high level while the block word lines corresponding to non-selected blocks are driven at low level so that a read current does not flow in any of MRAM cells of non-selected blocks; and during standby, all block word lines are driven at low level so that a read current does not flow in any of MRAM cells of all blocks.

22. An MRAM device comprising a plurality of MRAM cells arranged in the XY plane, a plurality of word lines Wi, a plurality of read bit lines Bj, a plurality of write bit lines Bpj-Bnj, a plurality of write bias lines Wpi-Wni, and a sense amplifier provided on an end of each of the read bit lines Bj, each MRAM cell comprising:

the MTJ cell according to claim 6; and a transistor Qr whose drain is connected to the terminal R of the MTJ cell;

wherein the gate of the transistor Qr is connected to an $i^{th}$ word line Wi (i=1, 2, ...);

the source of the transistor Qr is connected to a $j^{th}$ read bit line Bj (j=1, 2, ...);

terminals Wp and Wn of the MTJ cell are respectively connected to terminals Wn and Wp of MTJ cells in neighboring cells to form one of the write bit lines Bpj-Bnj (the ends of the line referred to as the Bpj end and Bnj end);

the third metal layer in the MTJ cell having opposite ends Pp and Pn that are respectively connected to ends Pn and Pp of the third metal layer in MTJ cells of neighboring MRAM cells to form an $i^{th}$ write bias line Wpi-Wni parallel to the word lines Wi;

a write operation for writing a "0" is performed by applying a prescribed write bias current only to the selected $i^{th}$ write bias line Wpi-Wni and applying a write current Iw to the write bit line Bpj-Bnj of the selected column ($j^{th}$ column) in a direction from the Bpj end to the Bnj end, producing an induced magnetic field that changes the direction of the easy axis of magnetization in the storage layer of the MTJ at the intersecting point (i, j) to match the direction of the easy axis of magnetization in the pinned layer, and a write operation for writing a "1" is performed by applying the write current Iw in the reverse direction, producing an induced magnetic field that changes the direction of the easy axis of magnetization in the storage layer to the direction opposite the easy axis of magnetization in the pinned layer; and a read operation, on the other hand, is performed by driving only the selected $i^{th}$ word line Wi at the high level so that the transistors Qr in all MRAM cells of the selected row are made conductive, and by applying the read voltage Vr to the write bit line Bpj-Bnj of the selected column ($j^{th}$ column), conducting the tunnel current that flows through the MTJ in the MRAM cell at intersecting point (i, j) to the read bit line Bj via the transistor Qr, and the sense amplifier provided on the read bit line Bj detects whether the tunnel current is large or small, i.e., "0" or "1".

23. The MRAM device according to claim 22, wherein the sense amplifier comprises a circuit for generating a reference voltage corresponding to an intermediate value of the tunnel current at "0" (large) and the tunnel current at "1" (small); and
   the resistive element providing resistors that determine the value of the reference voltage is a composite element including an MTJ cell storing a "0" and an MTJ cell storing a "1" formed during the fabrication process of the MRAM device by magnetizing or applying a magnetic field to a yoke whose quantum easy axis is aligned in the X-direction.

24. The MRAM device according to claim 23, comprising a plurality of the resistive elements arranged in at least one column in the Y-direction.

25. The MRAM device according to claim 22, further comprising a first driver DRpj and a second driver DRnj connected to respective ends of the write bit line Bpj-Bnj;
   wherein in a write operation the second driver DRnj constantly supplies the read voltage Vr, and the first driver DRpj supplies a write current Iw or a write current Iw in the reverse direction depending on whether the write data is a "1" or a "0".

26. The MRAM device according to claim 22, wherein the sense amplifier comprises a circuit for generating a reference voltage corresponding to an intermediate value of the tunnel current at "0" (large) and the tunnel current at "1" (small); and
   the resistive element providing resistors that determine the value of the reference voltage is one of (1) a semiconductor resistor, (2) an MTJ whose pinned layer and storage layer have magnetization in the Y-direction and X-direction, respectively, through a fabrication process, (3) an MTJ whose pinned layer and storage layer have magnetization in the Y-direction and X-direction, respectively, through their planar shape, (4) a composite element including an MTJ cell storing a "0" and an MTJ cell storing a "1" immediately after the MRAM device is powered on, and (5) an MTJ cell storing either a "0" or a "1" immediately after the MRAM device is powered on.

27. The MRAM device according to claim 22, wherein the MRAM cells connected to the word lines Wi are divided into a plurality of blocks;
   during a read or write operation, a block is selected based on the results of decoding a plurality of higher-order bits in column address data, and the block word line corresponding to the selected block is driven at high level while the block word lines corresponding to non-selected blocks are driven at low level so that a read current does not flow in any of MRAM cells of non-selected blocks; and
   during standby, all block word lines are driven at low level so that a read current does not flow in any of MRAM cells of all blocks.

28. An MRAM device comprising a plurality of MRAM cells arranged in the XY plane, a plurality of word lines Wi, a plurality of ground lines GND, a plurality of write bit lines Bpj-Bnj, a plurality of write bias lines Wpi-Wni, and a sense amplifier provided on an end of each of the write bit lines Bpj-Bnj, each MRAM cell comprising:
   the MTJ cell according to claim 6; and
   a transistor Qr whose drain is connected to the terminal R of the MTJ cell;
   wherein the gate of the transistor Qr is connected to the $i^{th}$ word line Wi (i=1, 2, . . . );
   the source of the transistor Qr is connected to one of the ground lines GND;
   terminals Wp and Wn of the MTJ cell are respectively connected in sequence to terminals Wn and Wp of MTJ cells in neighboring cells to form a write bit line Bpj-Bnj (the ends of the line referred to as the Bpj end and Bnj end);
   the third metal layer in the MTJ cell having opposite ends Pp and Pn that are respectively connected to ends Pn and Pp of the third metal layer in MTJ cells of neighboring MRAM cells to form an $i^{th}$ write bias line Wpi-Wni parallel to the word lines Wi;
   a write operation for writing a "0" is performed by applying a prescribed write bias current only to the selected $i^{th}$ write bias line Wpi-Wni and applying a write current Iw to the write bit line Bpj-Bnj of the selected column ($j^{th}$ column) in a direction from the Bpj end to the Bnj end, producing an induced magnetic field that changes the direction of the easy axis of magnetization in the storage layer of the MTJ at the intersecting point (i, j) to match the direction of the easy axis of magnetization in the pinned layer, and a write operation for writing a "1" is performed by applying the write current Iw in the reverse direction, producing an induced magnetic field that changes the direction of the easy axis of magnetization in the storage layer to the direction opposite the easy axis of magnetization in the pinned layer; and
   a read operation, on the other hand, is performed by driving only the selected $i^{th}$ word line Wi at the high level so that the transistors Qr in all MRAM cells of the selected row are made conductive, and by applying the read voltage Vr to the write bit line Bpj-Bnj of the selected column ($j^{th}$ column), conducting the tunnel current that flows through the MTJ in the MRAM cell at intersecting point (i, j) to the ground line GND via the transistor Qr, and the sense amplifier detects whether the tunnel current in the MTJ is large or small, i.e., "0" or "1".

29. The MRAM device according to claim 28, wherein the transistor Qr comprising the source, drain, and gate is formed in a silicon substrate covered by a wiring body comprising one or a plurality of insulating layers and one or a plurality of wiring layers superposed on each other, the source of the transistor Qr being connected to a ground line GND embedded in the wiring body and the gate being connected to a word line Wi (i=1, 2, . . . ) extending in the X-direction in the wiring body;
   the pinned layer, barrier layer, and storage layer of the MTJ forming the MTJ cell are stacked on top of the wiring body in the order given above the drain of the transistor Qr, and the bottom surface of the pinned layer is connected to the drain through a via provided in the wiring body;
   the write bit line Bpj-Bnj is provided along the Y-direction above the storage layer in each of the plurality of MTJs in the $j^{th}$ column and contacts each storage layer;
   yokes span across and cover individual portions of the write bit line Bpj-Bnj that contact the tops of the storage layers of all MTJs in the $j^{th}$ column; and the write bias lines Wpi-Wni extend in the X-direction above the write bit lines Bpj-Bnj and the yokes and are separated from the same by an insulating layer.

30. The MRAM device according to claim 29, wherein the transistor Qr is a vertical-type transistor comprising an $n^+$-type silicon region formed in the silicon substrate as a source; a polysilicon region provided on top of the silicon substrate and extending in the X-direction as a gate electrode; a cylindrical insulating film provided on the inner wall of a through-hole formed in the polysilicon region as a gate insulating film; a p-type silicon region filling space surrounded by the gate insulating film and contacted at the bottom by the $n^+$-type silicon region as a channel region; and an $n^+$-type silicon region contacting the top of the p-type silicon region as a drain.

31. The MRAM device according to claim 28, wherein the transistor Qr comprising the source, drain, and gate is formed in a silicon substrate covered by a wiring body comprising one or a plurality of insulating layers and one or a plurality of wiring layers superposed on each other, the source of the transistor Qr being connected to a ground line GND embedded in the wiring body and the gate being connected to a word line Wi (i=1, 2, . . . ) extending in the X-direction in the wiring body;
the write bias lines Wpi-Wni extend in the X-direction above the word lines Wi and/or the ground lines GND and are separated from the same by an insulating layer;
the pinned layer, barrier layer, and storage layer of the MTJ forming the MTJ cell are stacked on top of the wiring body in the order given above the write bias line Wpi-Wni, and the extended part of the pinned layer is connected to the drain through a via provided in the wiring body;
the write bit line Bpj-Bnj is provided along the Y-direction above the storage layer in each of the plurality of MTJs in the $j^{th}$ column and contacts each storage layer; and
yokes span across and cover individual portions of the write bit line Bpj-Bnj that contact the tops of the storage layers of all MTJs in the $j^{th}$ column.

32. The MRAM device according to claim 28, wherein the sense amplifier comprises a circuit for generating a reference voltage corresponding to an intermediate value of the tunnel current at "0" (large) and the tunnel current at "1" (small); and
the resistive element providing resistors that determine the value of the reference voltage is one of (1) a semiconductor resistor, (2) an MTJ whose pinned layer and storage layer have magnetization in the Y-direction and X-direction, respectively, through a fabrication process, (3) an MTJ whose pinned layer and storage layer have magnetization in the Y-direction and X-direction, respectively, through their planar shape, (4) a composite element including an MTJ cell storing a "0" and an MTJ cell storing a "1" immediately after the MRAM device is powered on, and (5) an MTJ cell storing either a "0" or a "1" immediately after the MRAM device is powered on.

33. The MRAM device according to claim 28, wherein the sense amplifier comprises a circuit for generating a reference voltage corresponding to an intermediate value of the tunnel current at "0" (large) and the tunnel current at "1" (small); and
the resistive element providing resistors that determine the value of the reference voltage is a composite element including an MTJ cell storing a "0" and an MTJ cell storing a "1" formed during the fabrication process of the MRAM device by magnetizing or applying a magnetic field to a yoke whose quantum easy axis is aligned in the X-direction.

34. The MRAM device according to claim 28, further comprising a first driver DRpj and a second driver DRnj connected to respective ends of the write bit line Bpj-Bnj;
wherein in a write operation the second driver DRnj constantly supplies the read voltage Vr, and the first driver DRpj supplies a write current Iw or a write current Iw in the reverse direction depending on whether the write data is a "1" or a "0".

35. The MRAM device according to claim 28, wherein the MRAM cells connected to the word lines Wi are divided into a plurality of blocks;
during a read or write operation, a block is selected based on the results of decoding a plurality of higher-order bits in column address data, and the block word line corresponding to the selected block is driven at high level while the block word lines corresponding to non-selected blocks are driven at low level so that a read current does not flow in any of MRAM cells of non-selected blocks; and
during standby, all block word lines are driven at low level so that a read current does not flow in any of MRAM cells of all blocks.

36. An MRAM device having a plurality of blocks arranged in a Y-direction, each block having a plurality of MRAM cells arranged in the XY plane, a plurality of word lines Wi, a plurality of ground lines GND, a plurality of write bit lines, a plurality of first write bit lines Bpj, a plurality of second write bit lines Bnj, a single block select/write enable (BS/WE), and a sense amplifier provided on an end of each of the first write bit lines Bpj or second write bit lines Bnj, and each MRAM cell comprising:
the MTJ cell according to claim 6; and
a transistor Qr whose drain is connected to the terminal R of the MTJ cell;
wherein the gate of the transistor Qr is connected to an $i^{th}$ word line Wi (i=1, 2, . . . );
the source of the transistor Qr is connected to one of the ground lines GND;
terminals Wp and Wn of the MTJ cell are respectively connected in sequence to terminals Wn and Wp of MTJ cells in neighboring cells to form one of the write bit lines;
the MRAM device further comprises transistors Qe whose drain is connected to an end of one of the write bit lines and whose gate is connected to the block select/write enable (BS/WE) of the corresponding block;
the other end of the write bit line is connected to a $j^{th}$ first write bit line Bpj (j=1, 2, . . . ) extending in the Y-direction through the plurality of blocks;
the source of the transistor Qe is connected to a $j^{th}$ second write bit line Bnj extending in the Y-direction through the plurality of blocks;
the third metal layer in the MTJ cell having opposite ends Pp and Pn that are respectively connected to ends Pn and Pp of the third metal layer in MTJ cells of neighboring MRAM cells to form an $i^{th}$ write bias line Wpi-Wni parallel to the word lines Wi;
a write operation for writing a "0" is performed by applying a prescribed write bias current only to the selected ith write bias line Wpi-Wni of a block selected by driving the block select/write enable (BS/WE) at the high level and applying a write current Iw to the write bit lines of the selected column ($j^{th}$ column) in a direction from the $j^{th}$ first write bit line Bpj toward the $j^{th}$ second write bit line Bnj through a transistor Qe selected by the block select/write enable (BS/WE), producing an induced magnetic field that changes the direction of the easy axis of magnetization in the storage layer of the MTJ at the intersecting point (i, j) to match the direction of the easy axis of magnetization in the pinned layer, and a write operation for writing a "1" is performed by applying the write current Iw in the reverse direction, producing an induced magnetic field that changes the direction of the easy axis of magnetization in the storage layer to the direction opposite the easy axis of magnetization in the pinned layer; and a read operation, on the other hand, is performed by driving only the selected $i^{th}$ word line Wi of the selected block at the high level so that the transistors Qr in all MRAM cells of the selected row are made conductive, and by applying the read voltage Vr to the first and second write bit lines Bpj and Bnj of the selected column ($j^{th}$ column), conducting the tunnel current that flows through the MTJ in the MRAM cell at intersecting point (i, j) to the ground line GND via the transistor Qr, and the sense amplifier detects whether the tunnel current in the MTJ is large or small, i.e., "0" or "1".

37. The MRAM device according to claim 36, further comprising a first driver DRpj connected to the source of the transistor Qe and a second driver DRnj connected to the Bnj end of the write bit line Bpj-Bnj;

wherein in a write operation the first driver DRpj and the second driver DRnj respectively supply a high voltage VH and a low voltage VL to produce a write current Iw determined by the transistor Qe, or the first driver DRpj and the second driver DRnj respectively supply the low voltage VL and the high voltage VH to produce a write current Iw in the reverse direction determined by the transistor Qe; and the read voltage Vr is larger than the low voltage VL but smaller than the high voltage VH.

38. The MRAM device according to claim 36, wherein the sense amplifier comprises a circuit for generating a reference voltage corresponding to an intermediate value of the tunnel current at "0" (large) and the tunnel current at "1" (small); and the resistive element providing resistors that determine the value of the reference voltage is one of (1) a semiconductor resistor, (2) an MTJ whose pinned layer and storage layer have magnetization in the Y-direction and X-direction, respectively, through a fabrication process, (3) an MTJ whose pinned layer and storage layer have magnetization in the Y-direction and X-direction, respectively, through their planar shape, (4) a composite element including an MTJ cell storing a "0" and an MTJ cell storing a "1" immediately after the MRAM device is powered on, and (5) an MTJ cell storing either a "0" or a "1" immediately after the MRAM device is powered on.

39. The MRAM device according to claim 36, wherein the sense amplifier comprises a circuit for generating a reference voltage corresponding to an intermediate value of the tunnel current at "0" (large) and the tunnel current at "1" (small); and the resistive element providing resistors that determine the value of the reference voltage is a composite element including an MTJ cell storing a "0" and an MTJ cell storing a "1" formed during the fabrication process of the MRAM device by magnetizing or applying a magnetic field to a yoke whose quantum easy axis is aligned in the X-direction.

40. The MRAM device according to claim 36, wherein the MRAM cells connected to the word lines Wi are divided into a plurality of blocks;

during a read or write operation, a block is selected based on the results of decoding a plurality of higher-order bits in column address data, and the block word line corresponding to the selected block is driven at high level while the block word lines corresponding to non-selected blocks are driven at low level so that a read current does not flow in any of MRAM cells of non-selected blocks; and during standby, all block word lines are driven at low level so that a read current does not flow in any of MRAM cells of all blocks.

41. A method of fabricating the MTJ cell, including steps of:

forming, elongated in an X-direction, a first metal layer on the surface of a substrate;

forming a magnetic tunnel junction ("MTJ") on the first metal layers, the MTJ comprising a ferromagnetic pinned layer, a nonmagnetic barrier layer, and a ferromagnetic storage layer stacked in the order given;

forming, elongated in the Y-direction (orthogonal to the X-direction), a second metal layer on the MTJ such that the MTJ includes extended parts not covered by the second metal layer;

forming a nonmagnetic insulating layer comprising a first insulating layer and a second insulating layer;

wherein:

the first insulating layer is formed, shaped with a bird's beak, the tip of the bird's beak reaching the sloped surface of the storage layer, through deposition at a first angle of incidence, while the second insulating layer is formed on top of the first insulating layer and shaped with a bird's beak, the tip of the bird's beak not reaching above the sloped surface of the storage layer, through deposition at a second angle of incidence different from the first angle of incidence, forming a yoke comprising a ferromagnetic material or a high-permeability magnetic material, spanning across and covering a portion of the second metal layer, with both ends of the yoke in the X-direction contacting the extended parts of the storage layer not covered by the second metal layer, indirectly through the nonmagnetic insulating layer; and forming a third metal layer elongated in the X-direction, between any of the neighboring steps mentioned above;

wherein the storage layer of the MTJ has a shape in an XY plane possessing a quantum easy axis in the X-direction, and the yoke has a shape in an XY plane possessing a quantum easy axis in the X-direction.

* * * * *